US006855959B2

(12) United States Patent
Yamaguchi et al.

(10) Patent No.: US 6,855,959 B2
(45) Date of Patent: Feb. 15, 2005

(54) NITRIDE BASED SEMICONDUCTOR PHOTO-LUMINESCENT DEVICE

(75) Inventors: Atsushi Yamaguchi, Tokyo (JP); Masaru Kuramoto, Tokyo (JP); Masaaki Nido, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/816,754

(22) Filed: Mar. 26, 2001

(65) Prior Publication Data

US 2001/0032975 A1 Oct. 25, 2001

(30) Foreign Application Priority Data

Mar. 24, 2000 (JP) ........................................ 2000-085198

(51) Int. Cl.[7] .............................................. H01L 33/00
(52) U.S. Cl. .................... 257/98; 257/101; 257/102; 257/103; 257/87; 257/14; 257/23; 257/611
(58) Field of Search ........................ 257/98, 101–103, 257/87, 14, 23, 611

(56) References Cited

U.S. PATENT DOCUMENTS

| | | | | |
|---|---|---|---|---|
| 3,962,716 A | * | 6/1976 | Petroff et al. | 357/18 |
| 6,010,937 A | * | 1/2000 | Karam et al. | 438/363 |
| 6,015,979 A | * | 1/2000 | Sugiura et al. | 257/86 |
| 6,111,277 A | * | 8/2000 | Ikeda | 257/99 |
| 6,153,010 A | * | 11/2000 | Kiyoku et al. | 117/95 |
| 6,316,785 B1 | * | 11/2001 | Nunoue et al. | 257/14 |

FOREIGN PATENT DOCUMENTS

| | | | |
|---|---|---|---|
| JP | 04-127521 | | 4/1992 |
| JP | 09153643 A | * | 6/1997 |
| JP | 11-191637 | | 7/1999 |
| JP | A 2000-4063 | | 1/2000 |
| JP | A 2000-21789 | | 1/2000 |
| JP | A 2000-58915 | | 2/2000 |
| JP | A 2000-77785 | | 3/2000 |
| WO | 97/11518 | | 3/1997 |

OTHER PUBLICATIONS

Shuji Nakamura et al., "InGaN/GaN/AlGaN–Based Laser––Diodes with Modulation–Doped Strained–layer Superlattices," Jpn.J. Appl. Phys., V. 36, 1997, pp. 1568–1571.
Applied Physics, V. 68, No. 7, 1999, pp. 793–796.

* cited by examiner

Primary Examiner—Nathan J. Flynn
Assistant Examiner—Remmon R. Fordé
(74) Attorney, Agent, or Firm—Young & Thompson

(57) ABSTRACT

A nitride based semiconductor photo-luminescent device has an active layer having a quantum well structure. The active layer has both a high dislocation density region and a low dislocation density region that is lower in dislocation density than the high dislocation density region, wherein the low dislocation density region includes a current injection region into which a current is injected, and the active layer is less than $1 \times 10^{18}$ cm$^{-3}$ in impurity concentration.

34 Claims, 4 Drawing Sheets

NITRIDE BASED SEMICONDUCTOR PHOTO-LUMINESCENT DEVICE

BACKGROUND OF THE INVENTION

The present invention relates to a nitride based semiconductor device, and more particularly to a nitride based semiconductor photo-luminescent device.

A nitride based semiconductor is an extremely important material for a blue-color laser diode. In Jpn. J. Appl. Phys. Vol. 36 (1997), pp. L1568–1571, Nakamura et al. reported that a continuous photo-luminescence life-time over 10,000 hours at 2 mW output at room temperature was confirmed. FIG. 1 is a fragmentary cross sectional elevation view illustrative of a first conventional nitride based semiconductor laser diode. In order to increase the life-time of the laser diode, it is essential to reduce the dislocation density of the active layer. The first conventional nitride based semiconductor laser diode has the following structure. A stripe-shaped silicon dioxide mask 103 having window regions is selectively formed over a gallium nitride layer 102 over a top surface of a sapphire substrate 101, so that a gallium nitride layer is grown over the stripe-shaped silicon dioxide mask 103 and over the gallium nitride layer 102, wherein the gallium nitride layer has low dislocation density regions 104 which are positioned over the stripe-shaped silicon dioxide mask 103. A p-electrode 105 is positioned over the low dislocation density region 104.

A gallium nitride layer 102 is grown on the sapphire substrate 101 by a metal organic chemical vapor deposition method. The sapphire substrate 101 has a high surface dislocation density. The gallium nitride layer 102 has a high dislocation density. A stripe-shaped silicon dioxide mask 103 having window regions is formed over the gallium nitride layer 102 in a [1–1,0,0]-direction. A gallium nitride layer 106 is grown by a metal organic chemical vapor deposition method using the stripe-shaped silicon dioxide mask 103 with the window regions. The gallium nitride layer 106 has a high dislocation density region 116 and a low dislocation density region 104. The high dislocation density region 116 is formed on the gallium nitride layer 102 having a high dislocation density. The high dislocation density region 116 is grown in a vertical direction from gallium nitride layer 102 having a high dislocation density shown by the window regions of the stripe-shaped silicon dioxide mask 103, for which reason the dislocation is propagated from the gallium nitride layer 102 to the high dislocation density region 116, whereby the high dislocation density region 116 has a high dislocation density. The low dislocation density region 104 is formed over the stripe-shaped silicon dioxide mask 103. The low dislocation density region 104 is grown by the epitaxial lateral overgrowth from the window regions of the stripe-shaped silicon dioxide mask 103. The stripe-shaped silicon dioxide mask 103 cuts the further propagation of the dislocation from the sapphire substrate 101. The low dislocation density region 104 has a low dislocation density. At the center of the low dislocation density region 104, epitaxial lateral overgrowths of gallium nitride in various lateral directions from the window regions of the stripe-shaped silicon dioxide mask 103 come together, whereby new dislocations are formed, for which reason the center region of the low dislocation density region 104 has a high dislocation density. As a result, an Si-doped n-type gallium nitride epitaxial lateral overgrowth substrate 100 is completed which has the high dislocation density region 116 and the low dislocation density region 104.

An Si-doped n-type $In_{0.1}Ga_{0.9}N$ layer 107 is formed over the Si-doped n-type gallium nitride epitaxial lateral overgrowth substrate 100. An n-type cladding layer 108 is formed over the Si-doped n-type $In_{0.1}Ga_{0.9}N$ layer 107, wherein the n-type cladding layer 108 comprises 120 periods of alternating laminations of an Si-doped n-type GaN layer having a thickness of 2.5 nanometers and an undoped $Al_{0.14}Ga_{0.86}N$ layer having a thickness of 2.5 nanometers. An Si-doped n-type GaN optical confinement layer 109 having a thickness of 0.1 micrometers is formed over the n-type cladding layer 108. A multiple quantum well active layer 210 is formed over the Si-doped n-type GaN optical confinement layer 109, wherein the multiple quantum well active layer 210 comprises alternating laminations of Si-doped n-type $In_{0.15}Ga_{0.85}N$ quantum well layer having a thickness of 3.5 nanometers and an Si-doped n-type $In_{0.2}Ga_{0.98}N$ potential barrier layer having a thickness of 10.5 nanometers. An Mg-doped p-type $Al_{0.2}Ga_{0.8}N$ cap layer 111 having a thickness of 20 nanometers is formed over the multiple quantum well active layer 210. An Mg-doped p-type GaN optical confinement layer 112 having a thickness of 0.1 micrometer is formed over the Mg-doped p-type $Al_{0.2}Ga_{0.8}N$ cap layer 111. A p-type cladding layer 113 is formed over the Mg-doped p-type GaN optical confinement layer 112, wherein the p-type cladding layer 113 comprises 120 periods of alternating laminations of an Mg-doped p-type GaN layer having a thickness of 2.5 nanometers and an undoped $Al_{0.14}Ga_{0.86}N$ layer having a thickness of 2.5 nanometers. An Mg-doped p-type GaN contact layer 114 having a thickness of 0.05 micrometers is formed over the p-type cladding layer 113. The lamination structure over the Si-doped n-type gallium nitride epitaxial lateral overgrowth substrate 100 is selectively removed by a dry etching process to form a ridge structure over a predetermined region of the top surface of the Si-doped n-type gallium nitride epitaxial lateral overgrowth substrate 100, wherein the ridge structure comprises laminations of the Si-doped n-type $In_{0.1}Ga_{0.9}N$ layer 107, the n-type cladding layer 108, the Si-doped n-type GaN optical confinement layer 109, the multiple quantum well active layer 210, the Mg-doped p-type $Al_{0.2}Ga_{0.8}N$ cap layer 111, the Mg-doped p-type GaN optical confinement layer 112, the p-type cladding layer 113 and the Mg-doped p-type GaN contact layer 114. The Mg-doped p-type GaN contact layer 114 is positioned over the low dislocation density region 104 for current injection into the low dislocation density region 104. A p-electrode 105 is formed on the Mg-doped p-type GaN contact layer 114, wherein the p-electrode 105 comprises an Ni layer and an Au layer. An n-electrode 115 is also selectively formed over the top surface of the Si-doped n-type gallium nitride epitaxial lateral overgrowth substrate 100, wherein the n-electrode 115 comprises an Ni layer and an Au layer. The n-electrode 115 is also positioned over the low dislocation density region 104 for current injection into the low dislocation density region 104.

The gallium nitride substrate formed in the above conventional method is so called to as "epitaxial lateral overgrowth gallium nitride substrate". The sapphire substrate 101 has a high surface dislocation density. The gallium nitride layer 102 grown over the sapphire substrate 101 also has a high dislocation density. The gallium nitride layer 106 has a high dislocation density region 116 positioned over the window regions of the stripe-shaped silicon dioxide mask 103 and a low dislocation density region 104 positioned over the stripe-shaped silicon dioxide mask 103. The high dislocation density region 116 of the gallium nitride layer 106 was grown over the gallium nitride layer 102 having the high dislocation density, for which reason the high dislocation density region 116 of the gallium nitride layer 106 also has a high dislocation density. The stripe-shaped silicon dioxide mask 103 is made of silicon dioxide free of dislocation, for which reason the low dislocation density region 104 grown over the stripe-shaped silicon dioxide mask 103 has a low dislocation density. The high dislocation density region 116 has a high dislocation density of $1 \times 10^{12}$ m$^{-2}$. The stripe-shaped silicon dioxide mask 103 cuts the propagation of the dislocation from the sapphire substrate 101. The low dislocation density region 104 has a low dislocation density of $1 \times 10^{11}$ m$^{-2}$. The low dislocation density region 104 is formed by the epitaxial lateral overgrowth of gallium nitride from the window regions of the stripe-shaped silicon dioxide mask 103. At the center of the low dislocation density region 104, epitaxial lateral overgrowths of gallium nitride in various lateral directions from the window regions of the stripe-shaped silicon dioxide mask 103 come together, whereby new dislocations are formed, for which reason the center region of the low dislocation density region 104 has a high dislocation density. In FIG. 1, the high dislocation density region is represented by dot marks. The p-electrode 105 is formed over the low dislocation density region 104 except for its center region, so that a current is injected from the p-electrode 105 into the low dislocation density region of the active layer. If the current is injected into the high dislocation density region, then the deterioration in performance of the device is likely to appear. However, if the current is injected into the low dislocation density region, then the deterioration in performance of the device is unlikely to appear, resulting in a long life-time of the device.

A second conventional method of forming a low dislocation density region was reported by Nakamura et al. in Applied Physics vol. 68-7, pp. 793–796. A GaN layer is formed on a sapphire substrate. The GaN layer is selectively removed by a dry etching process to form stripe-shaped GaN layers. Further, a GaN layer is formed over the stripe-shaped GaN layers and over the sapphire substrate. The GaN layer is epitaxially grown in vertical direction from the top surfaces of the stripe-shaped GaN layers and also epitaxially grown by an epitaxial lateral overgrowth in lateral direction from the top surfaces of the stripe-shaped GaN layers toward the top surface of the sapphire substrate. This growth will hereinafter referred to as a "mask-less epitaxial lateral overgrowth". The GaN layer has a high dislocation density region over the stripe-shaped GaN layer and a low dislocation density region over the sapphire substrate. Namely, the low dislocation density region is grown by the epitaxial lateral overgrowth from the stripe-shaped GaN layers to the region over the uncovered top surface of the sapphire substrate. The stripe-shaped GaN layer has a high dislocation density. The dislocation of the stripe-shaped GaN layer is propagated to the high dislocation density region grown in the vertical direction over the stripe-shaped GaN layers. The dislocation of the stripe-shaped GaN layer is propagated to the low dislocation density region grown by the epitaxial lateral overgrowth from the stripe-shaped GaN layers to the region over the uncovered top surface of the sapphire substrate. A current is injected into the low dislocation density region to obtain a long life-time.

The present inventors reported in Jpn. J. Appl. Phys. Vol. 36 (1997), pp. L899–902 and in NEC Research and Development vol. 41 (2000) No. 1 pp. 74–85 that a low dislocation density region is formed in an entire region of the active layer or an entire region of the substrate by a facet-initiated epitaxial lateral overgrowth method using the stripe-shaped silicon dioxide masks. In accordance with the facet-initiated epitaxial lateral overgrowth, the stripe-shaped silicon dioxide masks are formed over the gallium nitride layer over the sapphire substrate to carry out a hydride vapor phase epitaxial growth, wherein the through dislocations are curved, whereby the high dislocation density region as the epitaxial lateral overgrowth is not formed. Thus, the dislocation density is suppressed low over the entire of the substrate.

As the technique for forming the low dislocation density GaN region has been progressed, then the life-time of the blue color nitride based semiconductor laser diode, which emits a laser beam of a wavelength in the range of about 400–500 nanometers, has been greatly improved.

The technique for doping silicon into the active layer has been used for improving the laser device performances such as the threshold current density. In Japanese laid-open patent publication No. 10-12969, it is disclosed that silicon impurity is doped into the active layer at an impurity concentration n the range of $1 \times 10^{19}$ m$^{-3}$ to $1 \times 10^{21}$ cm$^{-3}$ for improvement in the laser threshold value.

In Applied Physics Letter 73 (1998), pp. 496–498 and Proc. of the 2$^{nd}$ Int. Sym. on Blue Laser and Light Emitting Diodes (1998), p. 381, it is disclosed that the active layer is doped with silicon to reduce the threshold value. The mechanism of the threshold value reduction due to the silicon doping process to the active layer might be associated with a piezo electric field shielding effect due to the impurity doping and the improvement in the planarity of the quantum well structure. It has been known that the improvement of the laser device performance is obtainable by the silicon doping. It is the common technical sense that the advanced nitride based semiconductor laser diode has the active layer which is doped with silicon in the above technical viewpoint.

In view of the actual practical use of the laser diode, the reliability of the conventional nitride based semiconductor laser diode is still insufficient. If the nitride based semiconductor laser diode having a wavelength band of about 400–500 nanometers is used for emitting a laser beam for an optical disk such as a digital video disk, a long life-time of not less than 5000 hours at 30 mW and at 70° C. is necessary in consideration of the wiring operation. As reported by Nakamura et al. in JSAP International No. 1, pp. 5–17 (2000), the life-time of the conventional nitride based semiconductor laser diodes is only 500 hours at 30 mW and at 60° C.

In the above circumstances, it had been required to develop a novel nitride based semiconductor photo-luminescent device free from the above problem.

SUMMARY OF THE INVENTION

Accordingly, it is an object of the present invention to provide a novel nitride based semiconductor photo-luminescent device free from the above problems.

It is a further object of the present invention to provide a novel nitride based semiconductor photo-luminescent device having a long life-time under high temperature and high output conditions.

The present invention provides a nitride based semiconductor photo-luminescent device having an active layer having a quantum well structure, the active layer having both at least a high dislocation density region and at least a low dislocation density region lower in dislocation density than the high dislocation density region, wherein the low dislocation density region includes a current injection region into which a current is injected, and the active layer is less than $1 \times 10^{18}$ cm$^{-3}$ in impurity concentration.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
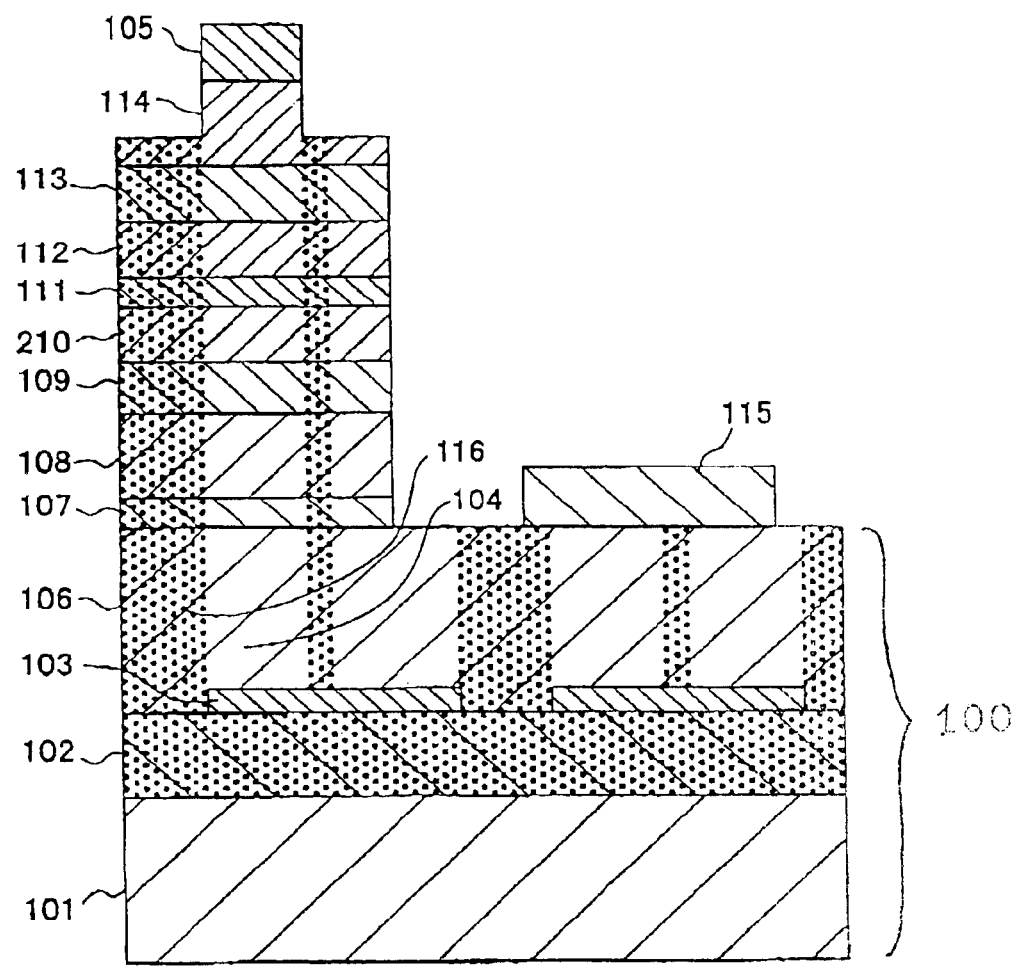
FIG. 1 is a fragmentary cross sectional elevation view illustrative of a first conventional nitride based semiconductor laser diode.

The present inventors found out the extremely important and unexpectable facts that if the active layer of the nitride based semiconductor laser device formed over the facet-initiated epitaxial lateral overgrowth gallium nitride substrate is undoped, then a low threshold value is obtained and a longer life-time is also obtained.

The present inventors investigated inter-relationships of the dislocation density distribution, the impurity concentration profile of the active layer, the threshold value of the laser device and the device life-time, wherein the laser diodes are concurrently, formed over both different type substrates, for example, the facet-initiated epitaxial lateral overgrowth substrate and the epitaxial lateral overgrowth substrate to prepare the first type semiconductor photo-luminescent devices over the facet-initiated epitaxial lateral overgrowth substrates and also prepare the second type semiconductor photo-luminescent devices over the epitaxial lateral overgrowth substrate. Furthermore, the first type semiconductor photo-luminescent devices over the facet-initiated epitaxial lateral overgrowth substrates may be classified into three different types in Si-impurity concentration in the quantum well active layer.

The first semiconductor photo-luminescent device is formed over the facet-initiated epitaxial lateral overgrowth substrate and has the Si-undoped quantum well active layer. The second semiconductor photo-luminescent device is formed over the facet-initiated epitaxial lateral overgrowth substrate and has the Si-doped quantum well active layer having a low Si-impurity concentration of $1\times10^{18}$ cm$^{-3}$. The third semiconductor photo-luminescent device is formed over the facet-initiated epitaxial lateral overgrowth substrate and has the Si-doped quantum well active layer having a high Si-impurity concentration of $5\times10^{18}$ cm$^{-3}$. The fourth semiconductor photo-luminescent device is formed over the epitaxial lateral overgrowth substrate and has the Si-undoped quantum well active layer. The fifth semiconductor photo-luminescent device is formed over the epitaxial lateral overgrowth substrate and has the Si-doped quantum well active layer having a low Si-impurity concentration of $1\times10^{18}$ cm$^{-3}$. The sixth semiconductor photo-luminescent device is formed over the epitaxial lateral overgrowth substrate and has the Si-doped quantum well active layer having a high Si-impurity concentration of $5\times10^{18}$ cm$^{-3}$.

The above first to sixth semiconductor photo-luminescent devices have the same structure as what will be described below in the first embodiment. For the epitaxial lateral overgrowth substrate, a silicon diode mask pattern is used which has a mask width of 20 micrometers and a window of 5 micrometers. This silicon dioxide mask pattern is much wider than the usual silicon dioxide mask pattern having a mask width of not more than about 10 micrometers for the epitaxial lateral overgrowth substrate. If the mask width is wide, then the wide silicon dioxide mask is buried with the gallium nitride layer by the lateral growth. This makes it difficult to obtain a highly plane layer over the wide silicon dioxide mask. This allows formation of a large low dislocation density region. In accordance with the present invention, a growth condition, for example, a flow rate ratio of Group III element source material and Group V element source material is optimized for forming a planer burying gallium nitride layer grown by the lateral growth over the wide silicon dioxide mask.

Table 1 shows averaged values of individual initial threshold current densities of the above first to sixth nitride based semiconductor laser emitting devices and the degrees of individual deteriorations of the above first to sixth nitride based semiconductor laser emitting devices after APC examination for 100 hours under high temperature and high output conditions of 70° C. and 30 mW.

TABLE 1

| | Threshold current density | deterioration |
|---|---|---|
| First device | 20 (mA/m$^2$) | no deterioration |
| Second device | 22 (mA/m$^2$) | no deterioration |
| Third device | 24 (mA/m$^2$) | no deterioration |
| Fourth device | 23 (mA/m$^2$) | no deterioration |
| Fifth device | 24 (mA/m$^2$) | no deterioration |
| Sixth device | 23 (mA/m$^2$) | slight voltage rise |

Threshold current density: initial threshold current density.
The first device: facet-initiated epitaxial lateral overgrowth; and Si-undoped quantum well active layer.
The second device: facet-initiated epitaxial lateral overgrowth; and Si-doped quantum well active layer of $1 \times 10^{18}$ cm$^{-3}$.
The third device: facet-initiated epitaxial lateral overgrowth; and Si-doped quantum well active layer of $5 \times 10^{18}$ cm$^{-3}$.
The fourth device: epitaxial lateral overgrowth; and Si-undoped quantum well active layer.
The fifth device: epitaxial lateral overgrowth; and Si-doped quantum well active layer of $1 \times 10^{18}$ cm$^{-3}$.
The sixth device: epitaxial lateral overgrowth; and Si-doped quantum well active layer of $5 \times 10^{18}$ cm$^{-3}$.

There is no large difference in the initial threshold current density in the first to sixth nitride-based semiconductor laser emitting devices. In the first and second nitride-based semiconductor laser emitting devices grown over the facet-initiated epitaxial lateral overgrowth substrates and having the Si-undoped active layer and the Si-doped active layer of $1\times10^{18}$ cm$^{-3}$, the initial threshold current densities are slightly lower than the remaining initial threshold current densities of the third to sixth nitride-based semiconductor laser emitting devices, even the Si-impurity concentrations are lower than $1\times10^{19}$ cm$^{-3}$. This means that the initial threshold current density has no large dependency upon the Si-impurity concentration. In the first to third nitride-based semiconductor laser emitting devices grown over the facet-initiated epitaxial lateral overgrowth substrates, the first nitride-based semiconductor laser emitting device has the lowest initial threshold current density, and the second nitride-based semiconductor laser emitting device has the second lowest initial threshold current density. If the nitride-based semiconductor laser emitting devices are grown over the facet-initiated epitaxial lateral overgrowth substrates, then the Si-undoped active layer obtains the lowest initial threshold current density. Further, the first to third nitride-based semiconductor laser emitting devices crown over the facet-initiated epitaxial lateral overgrowth substrates are free from any deterioration in performance. The fourth and fifth nitride-based semiconductor laser emitting devices grown over the epitaxial lateral overgrowth substrates and having the Si-undoped active layer and the Si-doped active layer of $1 \times 10^{18}$ cm$^{-3}$ are also free from any deterioration in performance. Only the sixth nitride-based semiconductor laser emitting device grown over the epitaxial lateral overgrowth substrate and having the Si-doped active layer of $5 \times 10^{18}$ cm$^{-3}$ shows a slight deterioration, for example, a slight voltage raise.

The above experimental results show that the deterioration of the device in the high temperature and high output operation relates to both the presence of the high dislocation density region and the Si-impurity concentration. If the low dislocation density region is entirely grown over the substrate by the facet-initiated epitaxial lateral overgrowth, then the deterioration is unlikely to appear. If not only the low dislocation density region but also the high dislocation density region are grown over the substrate by the epitaxial lateral overgrowth and it the current is injected into the low dislocation density region, then the deterioration is likely to appear. If not only the low dislocation density region but also the high dislocation density region are grown over the substrate by the epitaxial lateral overgrowth and if the impurity concentration of the active layer is small, then the deterioration is unlikely to appear.

Those mechanisms might be considered as follows. Under the high temperature and high output conditions, a large current flows through the device and a large heat generation is also caused, and further an intensity of the photo-luminescence is high. The heat energy and the energy of photons causes that the dislocations in non-current region outside the active layer extend to the active region, through which a current flows. Once the high discoloration density region reaches the active region, then the deterioration is likely to appear. Doping impurity into the active layer provides an influence to the extension of the dislocations. The impurity introduction causes the local strain in the crystal, thereby making the dislocation further extend and move, and further thereby causes that the photon is absorbed into the impurity level to generate a heat which promotes the extension and motion of the dislocation.

In order to prevent the deteriorations of the device, it is preferable that the entire region of the device is reduced in dislocation density. If the facet-initiated epitaxial lateral overgrowth substrate is used, the low dislocation density region extends entirely over the substrate. It is necessary for forming the facet-initiated epitaxial lateral overgrowth substrate to prepare not only the metal organic vapor phase epitaxy growth system but also a hydride vapor phase epitaxy growth system. This results in the high manufacturing cost. At the present, the epitaxial lateral overgrowth method and the mask-less epitaxial lateral overgrowth method are advantageous in cost reduction.

If the gallium nitride substrate is prepared by the epitaxial lateral overgrowth method or the mask-less epitaxial lateral overgrowth method, then the following two methods are effective to improve the device life-time under the high temperature and high output conditions. The first method is that the width of the silicon dioxide mask in the epitaxial lateral overgrowth method or the width of the sapphire-exposed region in the mask-less epitaxial lateral overgrowth method is wide to reduce the influence by the high dislocation density region. The second method is that the impurity concentration of the active layer is reduced to suppress the further extension or move of the high dislocation density region to the low dislocation density region.

The above first method needs the large area to be buried by the lateral overgrowth. This means that the growth time necessary for burying the large area by the lateral overgrowth is long, and further makes it difficult to form a plane or flat layer. Notwithstanding, it is possible to bury the flat layer over the large area, for example, the mask width of about 30 micrometers or the sapphire-exposed area of about 30 micrometers under the selected conditions for the lateral overgrowth, for example, the TMG flow rate is not more than 1 micro-mol per 1 minute.

The above second method is opposite to the conventional common sense that doping the silicon impurity reduces the threshold current density. As described above, the present inventors confirmed the fact that the large variation of the threshold current density is independent from the silicon impurity concentration. The experimental results using the facet-initiated epitaxial lateral overgrowth show it is important that the current injection region of the active layer has a low dislocation density and has a reduced number of defects.

The dislocation core causes the non-photo-luminescent re-combination of carriers. In order to suppress the non-photo-luminescent re-combination of carriers, it is effective to increase the impurity concentration of the active layer to shorten the carrier diffusion length thereby suppressing carriers from flowing into the dislocation cores. It has been known that if the impurity concentration is not less than $1 \times 10^{19}$ cm$^{-3}$, then Auger re-combination as the non-photo-luminescent re-combination of carriers frequently appears.

In accordance with the conventional common sense, if the dislocation density of the active layer is high, and the impurity concentration is increased to prevent the non-photo-luminescent recombination at the dislocation cores. The above experimental results show that if the current is injected into the largely reduced dislocation density region, it is more important to reduce the Auger re-combination rather reduce the non-photo-luminescent re-combination at the dislocation cores.

If the active layer comprises a single layered structure of a thickness of not less than 10 nanometers in place of the quantum well structure, the reduction of the Si-impurity concentration into less than $1 \times 10^{18}$ cm$^{-3}$ provides a smaller effect for improving the life-time than when the active layer comprises the quantum well structure. If the single layered structure of the active layer has a thickness of less than 10 nanometers, then the quantum effect possessed by the quantum well structure appears, wherein the state density has an abrupt rising edge which increases an optical gain and decreases the threshold current density value, whereby the temperature-dependent characteristics are improved. In this case, the reduction of the Si-impurity concentration into less than $1 \times 10^{18}$ cm$^{-3}$ provides a remarkable effect of improving the life-time as in case of the quantum well active layer.

The following is one of the reasons why the effect of improving the life-time is less remarkable if the active layer comprises a thick single layered structure of the thickness of more than 10 nanometers in place of the quantum well structure and if the Si-impurity concentration is less than $1 \times 10^{18}$ cm$^{-3}$. The reduction in the Si-impurity concentration of the thick single layered active layer increases the series resistance, whereby the heat generation is increased. The increase in the heat generation causes that even if the Si-impurity concentration is low, then the dislocations are likely to extend and move.

If the active layer comprises the quantum well structure, then the increase in the Si-impurity concentration shortens the life-time. As compared to the single layered active layer, a ratio in area of the interface to the volume of the active layer is remarkably increased. A segregation of the Si-impurity appears on the interface. Not only the interface recombination speed is increased, but also the extension and move of the dislocations are enhanced.

In accordance with the present invention, the following structures are provided for solving the above issues based on the above technical viewpoint.

The first present invention provides a nitride based semiconductor photo-luminescent device having an active layer having a quantum well structure, the active layer having both at least a high dislocation density region and at least a low dislocation density region lower in dislocation density than the high dislocation density region, wherein the low dislocation density region includes a current injection region into which a current is injected, and the active layer is less than $1\times10^{18}$ cm$^{-3}$ in impurity concentration.

Since the low dislocation density region includes a current injection region into which a current is injected, and the active layer is less than $1\times10^{18}$ cm$^{-3}$ in impurity concentration, then the Auger recombination is suppressed and also the extension and move of the high dislocation density region into the current injection region in the low dislocation density region are suppressed, whereby the device life-time under the high temperature and high output conditions is remarkably and greatly improved.

It is preferable that the nitride based semiconductor photo-luminescent device as claimed in claim 1, wherein a dislocation density of the low dislocation density region is not more than one tenth of a dislocation density of the high dislocation density region.

It is also preferable that a dislocation density of the current injection region is not more than one tenth of an averaged dislocation density of the active layer.

It is also preferable that a dislocation density of at least a part of the high dislocation density region is not less than $1\times10^{12}$ m$^{-2}$, and an average dislocation density of the current injection region in the low dislocation density region is less than $1\times10^{11}$ m$^{-2}$.

It is also preferable that an average dislocation density of the active layer is not less than $1\times10^{12}$ m$^{-2}$, and an average dislocation density of the current injection region in the low dislocation density region is less than $1\times10^{11}$ m$^{-2}$.

Since the dislocation density of the current injection region is not more than one tenth of the dislocation density of the high dislocation density region, and further the active layer is less than $1\times10^{18}$ cm$^{-3}$ in impurity concentration, then the effect is obtained for suppressing the dislocations from the extension and move from the high density dislocation region to the low dislocation density region, particularly into the current injection region.

It is also preferable that an average dislocation density of the current injection region is less than $1\times10^{11}$ m$^{-2}$, and an average dislocation density of a peripheral region within a distance of 5 micrometers from the current injection region in the low dislocation density region is not less than $1\times10^{12}$ m$^{-2}$.

It is also preferable that a current injection electrode is provided over an upper semiconductor layer overlying the active layer, and the active layer has an under-positioned region which is positioned under the current injection electrode, and an average dislocation density of the under-positioned region of the active layer is less than $1\times10^{11}$ m$^{-2}$, and an average dislocation density of a peripheral region within a distance of 5 micrometers from the under-positioned region is not less than $1\times10^{12}$ m$^{-2}$.

It is also preferable that an average dislocation density of a peripheral region within a distance of 5 micrometers from the current injection region in the low dislocation density region is not more than one tenth of an average dislocation density of the current injection region.

It is also preferable that a current injection electrode is provided over an upper semiconductor layer overlying the active layer, and the active layer has an under-positioned region which is positioned under the current injection electrode, and an average dislocation density of the under-positioned region of the active layer is not more than one tenth of an average dislocation density of an average dislocation density of a peripheral region within a distance of 5 micrometers from the under-positioned region.

Since a higher dislocation density region having a dislocation density of not less than ten times of a dislocation density of the current injection region is present in a peripheral region within a distance of 5 micrometers from the current injection region, and the active layer is less than $1\times10^{18}$ cm$^{-3}$ in impurity concentration, then the effect is obtained for suppressing the dislocations from the extension and move from the high density dislocation region to the low dislocation density region, particularly into the current injection region.

It is also preferable that the nitride based semiconductor photo-luminescent device is provided over mask patterns provided on a gallium nitride top surface of an epitaxial lateral overgrowth substrate. This structure is advantageous in cost reduction as compared to the facet-initiated epitaxial lateral overgrowth substrate.

It is also preferable that the mask patterns have a mask width of not less than 25 micrometers to increase the width of the low dislocation density region for suppressing the influence by the high dislocation density region and for obtaining the high reliability under the high temperature and high output conditions.

It is also preferable that the nitride based semiconductor photo-luminescent device is provided over selectively provided gallium nitride layers over a semi-insulating substrate of a mask-less epitaxial lateral overgrowth substrate. This structure is advantageous in cost reduction as compared to the facet-initiated epitaxial lateral overgrowth substrate.

It is also preferable that the selectively provided gallium nitride layers have at least a window region having a window width of not less than 25 micrometers to increase the width of the low dislocation density region for suppressing the influence by the high dislocation density region and for obtaining the high reliability under the high temperature and high output conditions.

It is also preferable that the active layer is undoped.

It is also preferable that the active layer comprises a multiple quantum well structure comprising alternating laminations of undoped quantum well layers and undoped potential barrier layers.

It is also preferable that the active layer comprises a multiple quantum well structure comprising alternating laminations of undoped quantum well layers and Si-doped potential barrier layers having an impurity concentration of less than $1 \times 10^{18}$ cm$^{-3}$.

It is also preferable that the active layer comprises a multiple quantum well structure comprising alternating laminations of Si-doped quantum well layers having an impurity concentration of less than $1 \times 10^{18}$ cm$^{-3}$ and undoped potential barrier layers.

It is also preferable that the active layer comprises a multiple quantum well structure comprising alternating laminations of Si-doped quantum well layers having an impurity concentration of less than $1 \times 10^{18}$ cm$^{-3}$ and Si-doped potential barrier layers having an impurity concentration of less than $1 \times 10^{18}$ cm$^{-3}$.

The second present invention provides a nitride based semiconductor photo-luminescent device having an active layer over an epitaxial lateral overgrowth substrate having a dielectric mask pattern with a window region, the active layer having both at least a high dislocation density region positioned over the window region and at least a low dislocation density region positioned over the dielectric mask pattern, and the low dislocation density region being lower in dislocation density than the high dislocation density region, wherein the low dislocation density region includes a current injection region into which a current is injected, and the active layer is less than $1 \times 10^{18}$ cm$^{-3}$ in impurity concentration.

It is preferable that a dislocation density of the low dislocation density region is not more than one tenth of a dislocation density of the high dislocation density region.

It is also preferable that a dislocation density of the current injection region is not more than one tenth of an averaged dislocation density of the active layer.

It is also preferable that a dislocation density of at least a part of the high dislocation density region is not less than $1 \times 10^{12}$ m$^{-2}$, and an average dislocation density of the current injection region in the low dislocation density region is less than $1 \times 10^{11}$ m$^{-2}$.

It is also preferable that an average dislocation density of the active layer is not less than $1 \times 10^{12}$ m$^{-2}$, and an average dislocation density of the current injection region in the low dislocation density region is less than $1 \times 10^{11}$ m$^{-2}$.

It is also preferable that an average dislocation density of the current injection region is less than $1 \times 10^{11}$ m$^{-2}$, and an average dislocation density of a peripheral region within a distance of 5 micrometers from the current injection region in the low dislocation density region is not less than $1 \times 10^{12}$ m$^{-2}$.

It is also preferable that a current injection electrode is provided over an upper semiconductor layer overlying the active layer, and the active layer has an under-positioned region which is positioned under the current injection electrode, and an average dislocation density of the under-positioned region of the active layer is less than $1 \times 10^{11}$ m$^{-2}$, and an average dislocation density of a peripheral region within a distance of 5 micrometers from the under-positioned region is not less than $1 \times 10^{12}$ m$^{-2}$.

It is also preferable that an average dislocation density of a peripheral region within a distance of 5 micrometers from the current injection region in the low dislocation density region is not more than one tenth of an average dislocation density of the current injection region.

It is also preferable that a current injection electrode is provided over an upper semiconductor layer overlying the active layer, and the active layer has an under-positioned region which is positioned under the current injection electrode, and an average dislocation density of the under-positioned region of the active layer is not more than one tenth of an average dislocation density of an average dislocation density of a peripheral region within a distance of 5 micrometers from the under-positioned region.

It is also preferable that a higher dislocation density region having a dislocation density of not less than ten times of a dislocation density of the current injection region is present in a peripheral region within a distance of 5 micrometers from the current injection region.

It is also preferable that the dielectric mask patterns have a mask width of not less than 25 micrometers.

It is also preferable that the dielectric mask patterns comprise single-layered dielectric mask patterns.

It is also preferable that the dielectric mask patterns comprise dielectric multilayer reflective mirrors.

It is also preferable that the active layer is undoped.

It is also preferable that the active layer comprises a multiple quantum well structure comprising alternating laminations of undoped quantum well layers and undoped potential barrier layers.

It is also preferable that the active layer comprises a multiple quantum well structure comprising alternating laminations of undoped quantum well layers and Si-doped potential barrier layers having an impurity concentration of less than $1 \times 10^{18}$ cm$^{-3}$.

It is also preferable that the active layer comprises a multiple quantum well structure comprising alternating laminations of Si-doped quantum well layers having an impurity concentration of less than $1 \times 10^{18}$ cm$^{-3}$ and undoped potential barrier layers.

It is also preferable that the active layer comprises a multiple quantum well structure comprising alternating laminations of Si-doped quantum well layers having an impurity concentration of less than $1 \times 10^{18}$ cm$^{-3}$ and Si-doped potential barrier layers having an impurity concentration of less than $1 \times 10^{18}$ cm$^{-3}$.

The third present invention provides a nitride based semiconductor photo-luminescent device having an active layer over a mask-less epitaxial lateral overgrowth substrate having a stripe-shaped nitride based semiconductor pattern with a window region, the active layer having both at least a high dislocation density region positioned over the stripe-shaped nitride based semiconductor pattern and at least a low dislocation density region positioned over the window region, and the low dislocation density region being lower in dislocation density than the high dislocation density region, wherein the low dislocation density region includes a current injection region into which a current is injected, and the active layer is less than $1 \times 10^{18}$ cm$^{-3}$ in impurity concentration.

It is also preferable that a dislocation density of the low dislocation density region is not more than one tenth of a dislocation density of the high dislocation density region.

It is also preferable that a dislocation density of the current injection region is not more than one tenth of an averaged dislocation density of the active layer.

It is also preferable that a dislocation density of at least a part of the high dislocation density region is not less than $1 \times 10^{12}$ m$^{-2}$, and an average dislocation density of the current injection region in the low dislocation density region is less than $1 \times 10^{11}$ m$^{-2}$.

It is also preferable that an average dislocation density of the active layer is not less than $1 \times 10^{12}$ m$^{-2}$, and an average dislocation density of the current injection region in the low dislocation density region is less than $1 \times 10^{11}$ m$^{-2}$.

It is also preferable that an average dislocation density of the current injection region is less than $1 \times 10^{11}$ m$^{-2}$ and an average dislocation density of a peripheral region within a distance of 5 micrometers from the current injection region in the low dislocation density region is not less than $1 \times 10^{12}$ m$^{-2}$.

It is also preferable that a current injection electrode is provided over an upper semiconductor layer overlying the active layer, and the active layer has an under-positioned region which is positioned under the current injection electrode, and an average dislocation density of the under-positioned region of the active layer is less than $1 \times 10^{11}$ m$^{-2}$, and an average dislocation density of a peripheral region within a distance of 5 micrometers from the under-positioned region is not less than $1 \times 10^{12}$ m$^{-2}$.

It is also preferable that an average dislocation density of a peripheral region within a distance of 5 micrometers from the current injection region in the low dislocation density region is not more than one tenth of an average dislocation density of the current injection region.

It is also preferable that a current injection electrode is provided over an upper semiconductor layer overlying the active layer, and the active layer has an under-positioned region which is positioned under the current injection electrode, and an average dislocation density of the under-positioned region of the active layer is not more than one tenth of an average dislocation density of an average dislocation density of a peripheral region within a distance of 5 micrometers from the under-positioned region.

It is also preferable that a higher dislocation density region having a dislocation density of not less than ten times of a dislocation density of the current injection region is present in a peripheral region within a distance of 5 micrometers from the current injection region.

It is also preferable that the window region has a width of not less than 25 micrometers.

It is also preferable that the active layer is undoped.

It is also preferable that the active layer comprises a multiple quantum well structure comprising alternating laminations of undoped quantum well layers and undoped potential barrier layers.

It is also preferable that the active layer comprises a multiple quantum well structure comprising alternating laminations of undoped quantum well layers and Si-doped potential barrier layers having an impurity concentration of less than $1 \times 10^{18}$ cm$^{-3}$.

It is also preferable that the active layer comprises a multiple quantum well structure comprising alternating laminations of Si-doped quantum well layers having an impurity concentration of less than $1 \times 10^{18}$ cm$^{-3}$ and undoped potential barrier layers.

It is also preferable that the active layer comprises a multiple quantum well structure comprising alternating laminations of Si-doped quantum well layers having an impurity concentration of less than $1 \times 10^{18}$ cm$^{-3}$ and Si-doped potential barrier layers having an impurity concentration of less than $1 \times 10^{18}$ cm$^{-3}$.

Preferred Embodiment
First Embodiment

Figure 2:
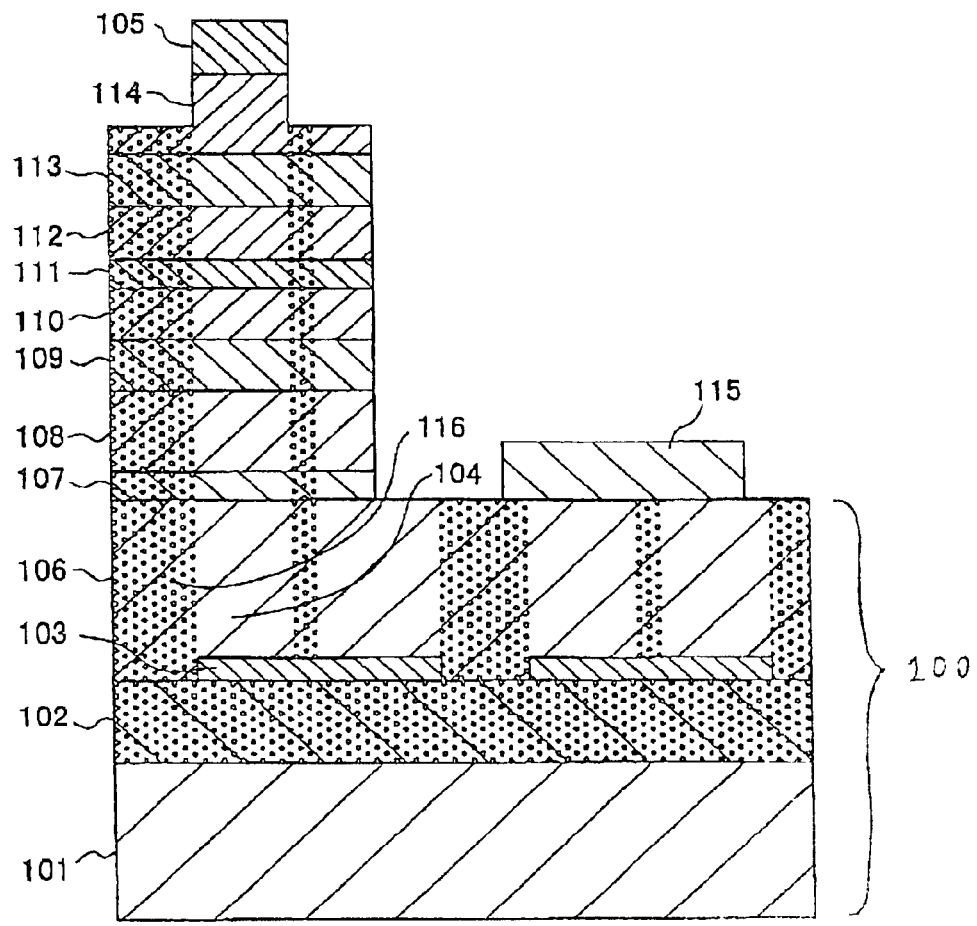
FIG. 2 is a fragmentary cross sectional elevation view illustrative of a first novel nitride based semiconductor laser diode in a first embodiment according to the present invention.

A first embodiment according to the present invention will be described in detail with reference to the drawings. FIG. 2 is a fragmentary cross sectional elevation view illustrative of a first novel nitride based semiconductor laser diode in a first embodiment according to the present invention. The first novel nitride based semiconductor laser diode has the following structure. A stripe-shaped silicon dioxide mask 103 having window regions is selectively formed over a gallium nitride layer 102 over a top surface of a sapphire substrate 101, so that a gallium nitride layer is grown over the stripe-shaped silicon dioxide mask 103 and over the gallium nitride layer 102, wherein the gallium nitride layer has low dislocation density regions 104 which are positioned over the stripe-shaped silicon dioxide mask 103. Both a first type substrate having a silicon dioxide mask width of 10 micrometers and a second type substrate having a silicon dioxide mask width of 25 micrometers are prepared.

A gallium nitride layer 102 is grown on the sapphire substrate 101 by a metal organic chemical vapor deposition method. The sapphire substrate 101 has a high surface dislocation density. The gallium nitride layer 102 has a high dislocation density. A stripe-shaped silicon dioxide mask 103 having window regions is formed over the gallium nitride layer 102 in a [1,−1,0,0]-direction. A gallium nitride layer 106 is grown by a metal organic chemical vapor deposition method using the stripe-shaped silicon dioxide mask 103 with the window regions. The gallium nitride layer 106 has a high dislocation density region 116 and a low dislocation density region 104. The high dislocation density region 116 is formed on the gallium nitride layer 102 having a high dislocation density. The high dislocation density region 116 is grown in a vertical direction from gallium nitride layer 102 having a high dislocation density shown by the window regions of the stripe-shaped silicon dioxide mask 103, for which reason the dislocation is propagated from the gallium nitride layer 102 to the high dislocation density region 116, whereby the high dislocation density region 116 has a high dislocation density. The low dislocation density region 104 is formed over the stripe-shaped silicon dioxide mask 103. The low dislocation density region 104 is grown by the epitaxial lateral overgrowth from the window regions of the stripe-shaped silicon dioxide mask 103. The stripe-shaped silicon dioxide mask 103 cuts the further propagation of the dislocation from the sapphire substrate 101. The low dislocation density region 104 has a low dislocation density. At the center of the low dislocation density region 104, epitaxial lateral overgrowths of gallium nitride in various lateral directions from the window regions of the stripe-shaped silicon dioxide mask 103 come together whereby new dislocations are formed for which reason the center region of the low dislocation density region 104 has a high dislocation density. As a result, an Si-doped n-type gallium nitride epitaxial lateral overgrowth substrate 100 is completed which has the high dislocation density region 116 and the low dislocation density region 104.

An Si-doped n-type $In_{0.1}Ga_{0.9}N$ layer 107 is formed over the Si-doped n-type gallium nitride epitaxial lateral overgrowth substrate 100. An n-type cladding layer 108 is formed over the Si-doped n-type $In_{0.1}Ga_{0.9}N$ layer 107, wherein the n-type cladding layer 108 comprises 120 periods of alternating laminations of an Si-doped n-type GaN layer having a thickness of 2.5 nanometers and an undoped $Al_{0.14}Ga_{0.86}N$ layer having a thickness of 2.5 nanometers. An Si-doped n-type GaN optical confinement layer 109 having a thickness of 0.1 micrometers is formed over the n-type cladding layer 108. A multiple quantum well active layer 110 is formed over the Si-doped n-type GaN optical confinement layer 109, wherein the multiple quantum well active layer 110 comprises alternating laminations of undoped n-type $In_{0.15}Ga_{0.85}N$ quantum well layer having a thickness of 3.5 nanometers and an undoped n-type $In_{0.02}Ga_{0.98}N$ potential barrier layer having a thickness of 10.5 nanometers. An Mg-doped p-type $Al_{0.2}Ga_{0.8}N$ cap layer 111 having a thickness of 20 nanometers is formed over the multiple quantum well active layer 110. An Mg-doped p-type GaN optical confinement layer 112 having a thickness of 0.1 micrometer is formed over the Mg-doped p-type $Al_{0.2}Ga_{0.8}N$ cap layer 111. A p-type cladding layer 113 is formed over the Mg-doped p-type GaN optical confinement layer 112, wherein the p-type cladding layer 113 comprises 120 periods of alternating laminations of an Mg-doped p-type GaN layer having a thickness of 2.5 nanometers and an undoped $Al_{0.14}Ga_{0.86}N$ layer having a thickness of 2.5 nanometers. An Mg-doped p-type GaN contact layer 114 having a thickness of 0.05 micrometers is formed over the p-type cladding layer 113. The lamination structure over the Si-doped n-type gallium nitride epitaxial lateral overgrowth substrate 100 is selectively removed by a dry etching process to form a ridge structure over a predetermined region of the top surface of the Si-doped n-type gallium nitride epitaxial lateral overgrowth substrate 100, wherein the ridge structure comprises laminations of the Si-doped n-type $In_{0.1}Ga_{0.9}N$ layer 107, the n-type cladding layer 108, the Si-doped n-type GaN optical confinement layer 109, the undoped multiple quantum well active layer 110, the Mg-doped p-type $Al_{0.2}Ga_{0.8}N$ cap layer 111, the Mg-doped p-type GaN optical confinement layer 112, the p-type cladding layer 113 and the Mg-doped p-type GaN contact layer 114. The Mg-doped p-type GaN contact layer 114 is positioned over the low dislocation density region 104 for current injection into the low dislocation density region 104. A p-electrode 105 is formed on the Mg-doped p-type GaN contact layer 114, wherein the p-electrode 105 comprises an Ni layer and an Au layer. An n-electrode 115 is also selectively formed over the top surface of the Si-doped n-type gallium nitride epitaxial lateral overgrowth substrate 100, wherein the n-electrode 115 comprises an Ni layer and an Au layer. The n-electrode 115 is also positioned over the low dislocation density region 104 for current injection into the low dislocation density region 104.

As compared to the above first and second types novel devices, third to sixth types devices were also prepared. The above first type device has the undoped active region and has the silicon dioxide mask pattern width of 10 micrometers, wherein the quantum well layers and the potential barrier layers are undoped. The above second type device has the undoped active region and has the silicon dioxide mask pattern width of 25 micrometers. The third to sixth types devices have the Si-doped active layers. The third type device has the silicon dioxide mask pattern width of 50 micrometers and the Si-impurity concentration of $1\times10^{18}$ $cm^{-3}$ for each of the quantum well layers and the potential barrier layers in the active layer. The fourth type device has the silicon dioxide mask pattern width of 25 micrometers and the Si-impurity concentration of $1\times10^{18}$ $cm^{-3}$ for each of the quantum well layers and the potential barrier layers in the active layer. The fifth type device has the silicon dioxide mask pattern width of 10 micrometers and the Si-impurity concentration of $5\times10^{18}$ $cm^{-3}$ for each of the quantum well layers and the potential barrier layers in the active layer. The sixth type device has the silicon dioxide mask pattern width of 25 micrometers and the Si-impurity concentration of $5\times10^{18}$ $cm^{-3}$ for each of the quantum well layers and the potential barrier layers in the active layer.

Observations to the dislocations for each of the first to sixth types devices have been carried out by use of a transmission electron microscope. The high density dislocation region 116 and the low density dislocation region 104 are observed for each of the first to sixth types devices, wherein the dislocation density of the high dislocation density region 116 is about $5\times10^{12}$ $m^{-2}$, and the dislocation density of the low dislocation density region 104 is about $2\times10^{10}$ $m^{-2}$. A large difference in dislocation density was observed between the high dislocation density region 116 and the low dislocation density region 104. The dislocation density is measurable by the transmission electron microscope. The dislocation density may also be measurable by the etch-pit density. A mixture liquid of phosphoric acid and sulfuric acid is heated at 200° C. Samples of the above six types are dipped into the solution for about 1 hour to form etch-pits at the positions of the dislocations, wherein the etch-pit density almost corresponds to the dislocation density.

If the dislocation density or the etch-pit density is low, then it is necessary for realizing a highly accurate measurement that the number of dislocations or etch-pits distributed in a large area is counted. For example, the dislocation density is about $1\times10^{11}$ r $m^{-2}$, then the area of at least $1\times10^{-10}$ $m^2$ is necessary for the highly accurate measurement to the dislocation density or the etch-pit density. The area of at least $1\times10^{-10}$ $m^2$ corresponds to a 10 micrometers squares. If the gallium nitride layer is grown over the epitaxial lateral overgrowth substrate, then the dislocation density has a large special variation in a direction perpendicular to the longitudinal direction of the striped-shape silicon dioxide masks. It is preferable that the measurement is made in a rectangle-shaped area of 100 micrometers in a first direction and 1 micrometer in a second direction, wherein the first direction is parallel to the longitudinal direction of the striped-shape silicon dioxide masks, whilst the second direction is perpendicular to the longitudinal direction of the striped-shape silicon dioxide masks.

Table 2 shows averaged values of individual initial threshold current densities of the first to sixth samples and the degrees of individual deteriorations thereof after APC examination for 100 hours under high temperature and high output conditions of 70° C. and 30 mW.

TABLE 2

| | Threshold current density | deterioration |
|---|---|---|
| First sample | 22 ($mA/m^2$) | no deterioration |
| Second sample | 24 ($mA/m^2$) | no deterioration |
| Third sample | 24 ($mA/m^2$) | no deterioration |
| Fourth sample | 23 ($mA/m^2$) | no deterioration |
| Fifth sample | 23 ($mA/m^2$) | emission discontinuation |
| Sixth sample | 23 ($mA/m^2$) | no deterioration |

Threshold current density: initial threshold current density.
First sample: epitaxial lateral overgrowth; silicon dioxide mask width of 25 micrometers; and Si-undoped active layer.
Second sample: epitaxial lateral overgrowth; silicon dioxide mask width of 10 micrometers; and Si-undoped active layer.
Third sample: epitaxial lateral overgrowth; silicon dioxide mask width of 25 micrometers; and Si-doped active layer of $1 \times 10^{18}$ $cm^{-3}$.
Fourth sample: epitaxial lateral overgrowth; silicon dioxide mask width of 10 micrometers; and Si-doped active layer of $1 \times 10^{18}$ $cm^{-3}$.
Fifth sample: epitaxial lateral overgrowth; silicon dioxide mask width of 25 micrometers; and Si-doped active layer of $5 \times 10^{18}$ $cm^{-3}$.
Sixth sample: epitaxial lateral overgrowth; silicon dioxide mask width of 10 micrometers; and Si-doped active layer of $5 \times 10^{18}$ $cm^{-3}$.

There was no large difference in the initial threshold current density in the above first to sixth samples. The fifth sample having the mask width of 10 micrometers and the Si-impurity concentration of $5\times10^{18}$ $cm^{-3}$ for the active layer showed a remarkable deterioration, wherein the laser emission is discontinued before 100 hours operation, whilst the remaining first to fourth and sixth samples showed almost no deteriorations. The fifth sample was observed in dislocation by the transmission electron microscope. It was confirmed that the dislocations in the high dislocation density region extend to the low dislocation density region.

Before this examination, the high dislocation density region of each of the above first to sixth samples was distanced by about 3 micrometers from the current injection region of the active layer. After the examination, the high dislocation density region of the fifth sample only extends to the current injection region of the active layer. After the examination, the high dislocation density region of each of the above first and second samples remained distanced by about 3 micrometers from the current injection region of the active layer. Namely, the distribution of the dislocation density remained unchanged for the first and second samples having the undoped active layers. For the sixth sample, it was observed that the dislocations extend from the high dislocation density region 116 by about 5 micrometers toward the low dislocation density region 104 but did not reach the current injection region of the active layer.

In accordance with this embodiment, if the high dislocation density region 116 is present within 5 micrometers from the current injection region of the active layer, the low impurity concentration of not more than $1\times10^{18}$ cm$^{-3}$ of the active layer provides a remarkable effect of suppressing the dislocation motion and extension. If the active layer is undoped or the silicon dioxide mask width is not less than 25 micrometers, then the movement or extension of the dislocation from the high dislocation density region to the low dislocation density region is suppressed, the life-time of the laser device under the high temperature and high output conditions is remarkably and greatly improved.

In order to show the effect of the improved life-time of the device in this embodiment, the comparative samples were prepared, which have various dislocation densities of the high dislocation density region and the low dislocation density regions. The APC examinations were made for each of the comparative samples under the high temperature and high output conditions. The dislocation density is controllable by controlling the growth conditions for the selective growth process.

As a result, in accordance with the present embodiment, even if the dislocation density of the low dislocation density region is not more than one tenth of the dislocation density of the high dislocation density region, then the Si-undoped active layer results in no deterioration and provides the long life-time in consideration that the dislocation extends or moves from the high dislocation density region to deteriorate the device, if the spatial distribution of the dislocation density, for example, the in-plane variation of the dislocation density is not so large, then the above effect is small and the above result is the natural result. If the dislocation density is uniform spatially, then no further effect of improving the life-time is obtained.

The impurity doping into the active layer means the impurity doping into either any one or both of the quantum well layers and the potential barrier layers. Namely, all of the quantum well layers and the potential barrier layers in the active layer are undoped or Si-doped at an impurity concentration of less than $1\times10^{18}$ cm$^{-3}$ in order to realize the long-life-time of the device.

In place of the multiple quantum well active layer, the single layered InGaN active layer is used for a further comparative examination. If the thickness of the single layered InGaN active layer is not less than 10 nanometers, then the low impurity concentration of less than $1\times10^{18}$ cm$^{-3}$ provides no remarkable effect of improving the life-time as compared to the multiple quantum well active layer. If the thickness of the single layered InGaN active layer is less than 10 nanometers to form a single quantum well layer for, causing quantum effects, then the low impurity concentration of less than $1\times10^{18}$ cm$^{-3}$ provides such the remarkable effect of improving the life-time as the multiple quantum well active layer.

The following is one of the reasons why the effect of improving the life-time is less remarkable if the InGaN active layer comprises a thick single layered structure of the thickness of more than 10 nanometers in place of the quantum well structure and if the Si-impurity concentration is less than $1\times10^{18}$ cm$^{-3}$. The reduction in the Si-impurity concentration of the thick single layered active layer increases the series resistance, whereby the heat generation is increased. The increase in the heat generation causes that even if the Si-impurity concentration is low, then the dislocations are likely to extend and move.

If the active layer comprises the quantum well structure, then the increase in the Si-impurity concentration shortens the life-time. As compared to the single layered active layer, a ratio in area of the interface to the volume of the active layer is remarkably increased. A segregation of the Si-impurity appears on the interface. Not only the interface recombination speed is increased, but also the extension and move of the dislocations are enhanced.

As disclosed in Japanese laid-open patent publication No. 10-12969, other impurity such as Mg than Si is doped to reduce the threshold current density. If the other impurity is not doped into the active layer or the active layer is Mg-undoped, the life-time is largely and greatly improved under the high temperature and high output conditions. The present inventors prepared the different devices having the undoped active layer and the Mg-doped active layer for carrying out the APC examination at 70° C. and 30 mW. The deterioration of the device having the Mg-doped active layer is larger than the deterioration of the device having the undoped active layer.

In this embodiment, the novel nitride based semiconductor photo-luminescent device is applied to the semiconductor laser device. It is of course possible to apply the novel nitride based semiconductor photo-luminescent device to other devices such as the light emission diode and the super luminescent diode.

In accordance with the novel nitride based semiconductor photo-luminescent device, the active layer has the high dislocation density region and the low dislocation density region which has the current injection layer, and the active layer is less than $1\times10^{18}$ cm$^{-3}$ in impurity concentration to suppress the Auger re-combination and also suppress the extension and movement of the dislocations from the high dislocation density region to the current injection region in the low dislocation density region, whereby the life-time of the device under the high temperature and high output conditions is remarkably and greatly improved.

The nitride based semiconductor photo-luminescent device is formed over the mask patterns provided on the gallium nitride top surface of the epitaxial lateral overgrowth substrate, wherein said mask patterns have a mask width of not less than 25 micrometers to increase the width of the low dislocation density region for suppressing the influence by the high dislocation density region and for obtaining the high reliability under the high temperature and high output conditions.

Second Embodiment

A second embodiment according to the present invention will be described in detail with reference to the drawings.

Figure 3:
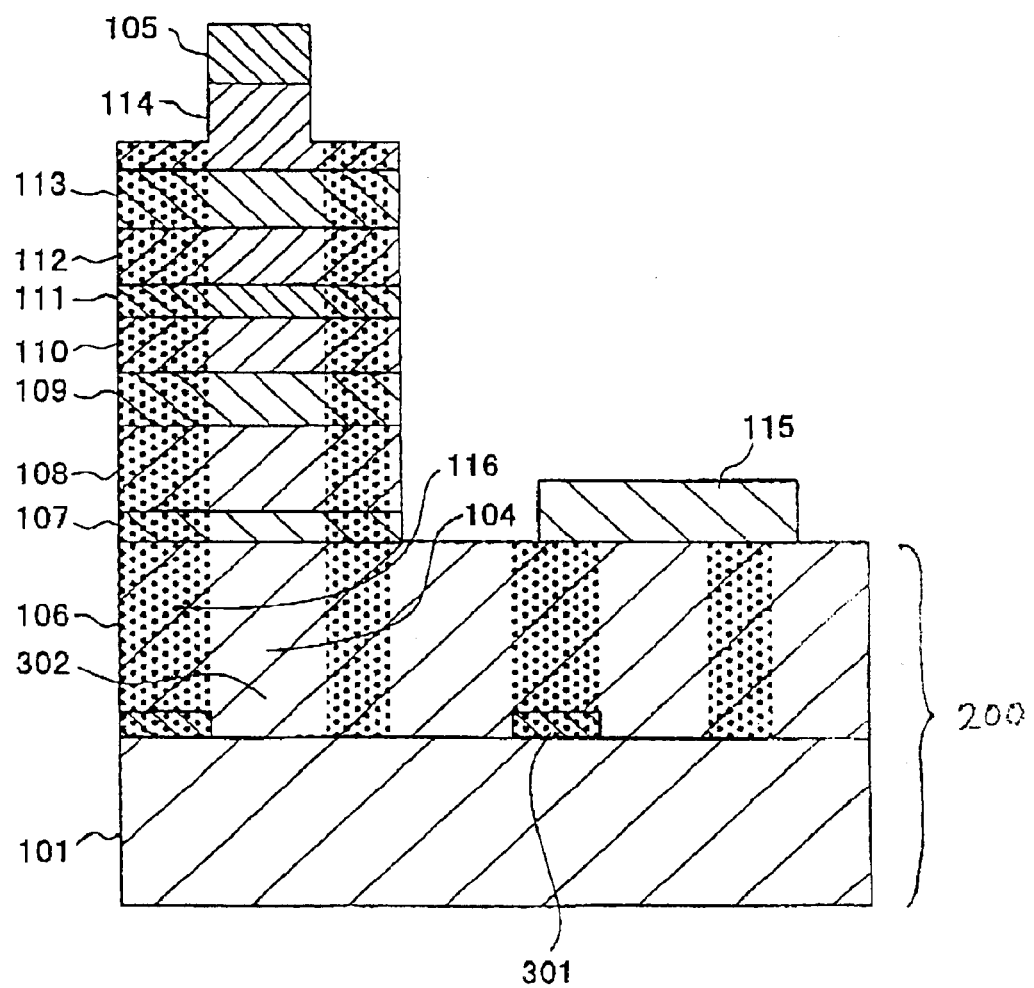
FIG. 3 is a fragmentary cross sectional elevation view illustrative of a second novel nitride based semiconductor laser diode in a second embodiment according to the present invention.

FIG. 3 is a fragmentary cross sectional elevation view illustrative of a second novel nitride based semiconductor laser diode in a second embodiment according to the present invention. The second novel nitride based semiconductor laser diode is formed over a mask-less epitaxial lateral overgrowth substrate a gallium nitride layer 102 is grown over a top surface of a sapphire substrate 101 by a metal organic chemical vapor deposition. A stripe-shape silicon dioxide mask 103 is formed over the gallium nitride layer 102, so that the gallium nitride layer 102 is then selectively etched by a dry etching process to form a stripe-shaped gallium nitride layer 301 with a window region. The stripe-shape silicon dioxide mask 103 is then removed from the stripe-shaped gallium nitride layer 301. An Si-doped n-type gallium nitride layer 302 is grown by the metal organic chemical vapor deposition method over the stripe-shaped gallium nitride layer 301 with the window region, on which the top surface of the sapphire substrate 101 is shown, wherein the epitaxial lateral overgrowth appears over the top surface of the sapphire substrate 101 shown through the window region of the stripe-shaped gallium nitride layer 301, whilst the normal epitaxial vertical growth appears over the stripe-shaped gallium nitride layer 301. The epitaxial lateral overgrowth forms the flat Si-doped n-type gallium nitride layer 302. The Si-doped n-type gallium nitride layer 302 has a low dislocation density region 104 which is positioned over the window region of the stripe-shaped gallium nitride layer 301. The Si-doped n-type gallium nitride layer 302 has a high dislocation density region 116 which is positioned over the stripe-shaped gallium nitride layer 301.

A gallium nitride layer 102 is grown on the sapphire substrate 101 by a metal organic chemical vapor deposition method. The sapphire substrate 101 has a high surface dislocation density. The gallium nitride layer 102 has a high dislocation density. A stripe-shaped silicon dioxide mask 103 having window regions is formed over the gallium nitride layer 102 in a [1,−1,0,0]-direction for subsequent dry etching to the gallium nitride layer 102 to form a stripe-shaped gallium nitride layer 301 with a window region. The stripe-shape silicon dioxide mask 103 is then removed from the stripe-shaped gallium nitride layer 301. An Si-doped n-type gallium nitride layer 302 is grown by the metal organic chemical vapor deposition method over the stripe-shaped gallium nitride layer 301 with the window region, on which the top surface of the sapphire substrate 101 is shown, wherein the epitaxial lateral overgrowth appears over the top surface of the sapphire substrate 101 shown through the window region of the stripe-shaped gallium nitride layer 301, whilst the normal epitaxial vertical growth appears over the stripe-shaped gallium nitride layer 301. The epitaxial lateral overgrowth forms the flat Si-doped n-type gallium nitride layer 302. The Si-doped n-type gallium nitride layer 302 has a high dislocation density region 116 and a low dislocation density region 104. The high dislocation density region 116 is formed on the stripe-shaped gallium nitride layer 301 having a high dislocation density. The high dislocation density region 116 is grown in a vertical direction from the stripe-shaped gallium nitride layer 301 having a high dislocation density, for which reason the dislocation is propagated from the stripe-shaped gallium nitride layer 301 to the Si-doped n-type gallium nitride layer 302, whereby the high dislocation density region 116 has a high dislocation density. The low dislocation density region 104 is formed over the top surface of the sapphire substrate 101 shown through the window region of the Si-doped n-type gallium nitride layer 302. The low dislocation density region 104 is grown by the epitaxial lateral overgrowth from the Si-doped n-type gallium nitride layer 302. The interface of the Si-doped n-type gallium nitride layer 302 to the sapphire substrate 101 cuts the further propagation of the dislocation from the sapphire substrate 101. The low dislocation density region 104 has a low dislocation density. At the center of the low dislocation density region 104, epitaxial lateral overgrowths of gallium nitride in various lateral directions from the Si-doped n-type gallium nitride layer 302 come together, whereby new dislocations are formed, for which reason the center region of the low dislocation density region 104 has a high dislocation density. As a result, an Si-doped n-type gallium nitride mask-less epitaxial lateral overgrowth substrate 200 is completed which has the high dislocation density region 116 and the low dislocation density region 104.

Both a first type substrate having a window region width of 10 micrometers and a second type substrate having a window region width of 25 micrometers are prepared.

Further, an Si-doped n-type $In_{0.1}Ga_{0.9}N$ layer 107 is formed over the Si-doped n-type gallium nitride mask-less epitaxial lateral overgrowth substrate 200. An n-type cladding layer 108 is formed over the Si-doped n-type $In_{0.1}Ga_{0.9}N$ layer 107, wherein the n-type cladding layer 108 comprises 120 periods of alternating laminations of an Si-doped n-type GaN layer having a thickness of 2.5 nanometers and an undoped $Al_{0.14}Ga_{0.86}N$ layer having a thickness of 2.5 nanometers. An Si-doped n-type GaN optical confinement layer 109 having a thickness of 0.1 micrometers is formed over the n-type cladding layer 108. A multiple quantum well active layer 110 is formed over the Si-doped n-type GaN optical confinement layer 109, wherein the multiple quantum well active layer 110 comprises alternating laminations of undoped n-type $In_{0.15}Ga_{0.85}N$ quantum well layer having a thickness of 3.5 nanometers and an undoped n-type $In_{0.02}Ga_{0.98}N$ potential barrier layer having a thickness of 10.5 nanometers. An Mg-doped p-type $Al_{0.2}Ga_{0.8}N$ cap layer 111 having a thickness of 20 nanometers is formed over the multiple quantum well active layer 110. An Mg-doped p-type GaN optical confinement layer 112 having a thickness of 0.1 micrometer is formed over the Mg-doped p-type $Al_{0.2}Ga_{0.8}N$ cap layer 111. A p-type cladding layer 113 is formed over the Mg-doped p-type GaN optical confinement layer 112, wherein the p-type cladding layer 113 comprises 120 periods of alternating laminations of an Mg-doped p-type GaN layer having a thickness of 2.5 nanometers and an undoped $Al_{0.14}Ga_{0.86}N$ layer having a thickness of 2.5 nanometers. An Mg-doped p-type GaN contact layer 114 having a thickness of 0.05 micrometers is formed over the p-type cladding layer 113. The lamination structure over the Si-doped n-type gallium nitride mask-less epitaxial lateral overgrowth substrate 200 is selectively removed by a dry etching process to form a ridge structure over a predetermined region of the top surface of the Si-doped n-type gallium nitride mask-less epitaxial lateral overgrowth substrate 200, wherein the ridge structure comprises laminations of the Si-doped n-type $In_{0.1}Ga_{0.9}N$ layer 107, the n-type cladding layer 108, the Si-doped fl-type GaN optical confinement layer 109, the undoped multiple quantum well active layer 110, the Mg-doped p-type $Al_{0.2}Ga_{0.8}N$ cap layer 111, the Mg-doped p-type GaN optical confinement layer 112, the p-type cladding layer 113 and the Mg-doped p-type GaN contact layer 114. The Mg-doped p-type GaN contact layer 114 is positioned over the low dislocation density region 104 for current injection into the low dislocation density region 104. A p-electrode 105 is formed on the Mg-doped p-type GaN contact layer 114, wherein the p-electrode 105 comprises an Ni layer and an Au layer. An n-electrode 115 is also selectively formed over the top surface of the Si-doped n-type gallium nitride mask-less epitaxial lateral overgrowth substrate 200, wherein the n-electrode 115 comprises an Ni layer and an Au layer. The n-electrode 115 is also positioned over the low dislocation density region 104 for current injection into the low dislocation density region 104.

As compared to the above first and second types novel devices, third to sixth types devices were also prepared. The above first type device has the undoped active region and has the window region width of 10 micrometers, wherein the quantum well layers and the potential barrier layers are undoped. The above second type device has the undoped active region and has the window region width of 25 micrometers. The third to sixth types devices have the Si-doped active layers. The third type device has the window region width of 10 micrometers and the Si-impurity concentration of $1\times10^{18}$ cm$^{-3}$ for each of the quantum well layers and the potential barrier layers in the active layer. The fourth type device has the window region width of 25 micrometers and the Si-impurity concentration of $1\times10^{18}$ cm$^{-3}$ for each of the quantum well layers and the potential barrier layers in the active layer. The fifth type device has the window region width of 10 micrometers and the Si-impurity concentration of $5\times10^{18}$ cm$^{-3}$ for each of the quantum well layers and the potential barrier layers in the active layer. The sixth type device has the window region width of 25 micrometers and the Si-impurity concentration of $5\times10^{18}$ cm$^{-3}$ for each of the quantum well layers and the potential barrier layers in the active layer.

Observations to the dislocations for each of the first to sixth types devices have been carried out by use of a transmission electron microscope. The high density dislocation region 116 and the low density dislocation region 104 are observed for each of the first to sixth types devices, wherein the dislocation density of the high dislocation density region 116 is about $5\times10^{12}$ m$^{-2}$, and the dislocation density of the low dislocation density region 104 is about $2\times10^{10}$ m$^{-2}$. A large difference in dislocation density was observed between the high dislocation density region 116 and the low dislocation density region 104. The dislocation density is measurable by the transmission electron microscope. The dislocation density may also be measurable by the etch-pit density. A mixture liquid of phosphoric acid and sulfuric acid is heated at 200° C. Samples of the above six types are dipped into the solution for about 1 hour to form etch-pits at the positions of the dislocations, wherein the etch-pit density almost corresponds to the dislocation density.

If the dislocation density or the etch-pit density is low, then it is necessary for realizing a highly accurate measurement that the number of dislocations or etch-pits distributed in a large area is counted. For example, the dislocation density is about $1\times10^{11}$ m$^{-2}$, then the area of at least $1\times10^{-10}$ m$^2$ is necessary for the highly accurate measurement to the dislocation density or the etch-pit density. The area of at least $1\times10^{-10}$ m$^2$ corresponds to a 10 micrometers squares. If the gallium nitride layer is grown over the epitaxial lateral overgrowth substrate, then the dislocation density has a large special variation in a direction perpendicular to the longitudinal direction of the striped-shape silicon dioxide masks. It is preferable that the measurement is made in a rectangle-shaped area of 100 micrometers in a first direction and 1 micrometer in a second direction, wherein the first direction is parallel to the longitudinal direction of the striped-shape silicon dioxide masks, whilst the second direction is perpendicular to the longitudinal direction of the striped-shape silicon dioxide masks.

Table 3 shows averaged values of individual initial threshold current densities of the first to sixth samples and the degrees of individual deteriorations thereof after APC examination for 100 hours under high temperature and high output conditions of 70° C. and 30 mW.

TABLE 3

| | Threshold current density | deterioration |
|---|---|---|
| First sample | 24 (mA/m$^2$) | no deterioration |
| Second sample | 23 (mA/m$^2$) | no deterioration |
| Third sample | 22 (mA/m$^2$) | no deterioration |
| Fourth sample | 24 (mA/m$^2$) | no deterioration |
| Fifth sample | 22 (mA/m$^2$) | emission discontinuation |
| Sixth sample | 23 (mA/m$^2$) | no deterioration |

Threshold current density: initial threshold current density.
First sample: mask-less epitaxial lateral overgrowth silicon dioxide mask width of 25 micrometers; and Si-undoped active layer.
Second sample: mask-less epitaxial lateral overgrowth silicon dioxide mask width of 10 micrometers; and Si-undoped active layer.
Third sample: mask-less epitaxial lateral overgrowth silicon dioxide mask width of 25 micrometers; and Si-doped active layer of $1\times10^{18}$ cm$^{-3}$.
Fourth sample: mask-less epitaxial lateral overgrowth silicon dioxide mask width of 10 micrometers; and Si-doped active layer of $1\times10^{18}$ cm$^{-3}$.
Fifth sample: mask-less epitaxial lateral overgrowth silicon dioxide mask width of 25 micrometers; and Si-doped active layer of $5\times10^{18}$ cm$^{-3}$.
Sixth sample: mask-less epitaxial lateral overgrowth silicon dioxide mask width of 10 micrometers; and Si-doped active layer of $5\times10^{18}$ cm$^{-3}$.

There was no large difference in the initial threshold current density in the above first to sixth samples. The fifth sample having the mask width of 10 micrometers and the Si-impurity concentration of $5\times10^{18}$ cm$^{-3}$ for the active layer showed a remarkable deterioration, wherein the laser emission is discontinued before 100 hours operation, whilst the remaining first to fourth and sixth samples showed almost no deteriorations. The fifth sample was observed in dislocation by the transmission electron microscope. It was confirmed that the dislocations in the high dislocation density region extend to the low dislocation density region.

Before this examination, the high dislocation density region of each of the above first to sixth samples was distanced by about 3 micrometers from the current injection region of the active layer. After the examination, the high dislocation density region of the fifth sample only extends to the current injection region of the active layer. After the examination, the high dislocation density region of each of the above first and second samples remained distanced by about 3 micrometers from the current injection region of the active layer. Namely, the distribution of the dislocation density remained unchanged for the first and second samples having the undoped active layers. For the sixth sample, it was observed that the dislocations extend from the high dislocation density region 116 by about 5 micrometers toward the low dislocation density region 104 but did not reach the current injection region of the active layer.

In accordance with this embodiment, if the high dislocation density region 116 is present within 5 micrometers from the current injection region of the active layer, the low impurity concentration of not more than $1\times10^{18}$ cm$^{-3}$ of the active layer provides a remarkable effect of suppressing the dislocation motion and extension. If the active layer is undoped or the silicon dioxide mask width is not less than 25 micrometers, then the movement or extension of the dislocation from the high dislocation density region to the low dislocation density region is suppressed, the life-time of the laser device under the high temperature and high output conditions is remarkably and greatly improved.

In order to show the effect of the improved life-time of the device in this embodiment, the comparative samples were prepared, which have various dislocation densities of the high dislocation density region and the low dislocation density regions. The APC examinations were made for each of the comparative samples under the high temperature and high output conditions. The dislocation density is controllable by controlling the growth conditions for the selective growth process.

As a result, in accordance with the present embodiment, even if the dislocation density of the low dislocation density region is not more than one tenth of the dislocation density of the high dislocation density region, then the Si-undoped active layer results in no deterioration and provides the long life-time in consideration that the dislocation extends or moves from the high dislocation density region to deteriorate the device, if the spatial distribution of the dislocation density, for example, the in-plane variation of the dislocation density is not so large, then the above effect is small and the above result is the natural result. If the dislocation density is uniform spatially, then no further effect of improving the life-time is obtained.

The impurity doping into the active layer means the impurity doping into either any one or both of the quantum well layers and the potential barrier layers. Namely, all of the quantum well layers and the potential barrier layers in the active layer are undoped or Si-doped at an impurity concentration of less than $1\times10^{18}$ cm$^{-3}$ in order to realize the long-life-time of the device.

In place of the multiple quantum well active layer, the single layered InGaN active layer is used for a further comparative examination. If the thickness of the single layered InGaN active layer is not less than 10 nanometers, then the low impurity concentration of less than $1\times10^{18}$ cm$^{-3}$ provides no remarkable effect of improving the life-time as compared to the multiple quantum well active layer. If the thickness of the single layered InGaN active layer is less than 10 nanometers to form a single quantum well layer for causing quantum effects, then the low impurity concentration of less than $1\times10^{18}$ m$^{-3}$ provides such the remarkable effect of improving the life-time as the multiple quantum well active layer.

The following is one of the reasons why the effect of improving the life-time is less remarkable if the InGaN active layer comprises a thick single layered structure of the thickness of more than 10 nanometers in place of the quantum well structure and if the Si-impurity concentration is less than $1\times10^{18}$ cm$^{-3}$. The reduction in the Si-impurity concentration of the thick single layered active layer increases the series resistance, whereby the heat generation is increased. The increase in the heat generation causes that even if the Si-impurity concentration is low, then the dislocations are likely to extend and move.

If the active layer comprises the quantum well structure, then the increase in the Si-impurity concentration shortens the life-time. As compared to the single layered active layer, a ratio in area of the interface to the volume of the active layer is remarkably increased. A segregation of the Si-impurity appears on the interface. Not only the interface recombination speed is increased, but also the extension and move of the dislocations are enhanced.

If the other impurity is not doped into the active layer or the active layer is Mg-undoped, the life-time is largely and greatly improved under the high temperature and high output conditions. The present inventors prepared the different devices having the undoped active layer and the Mg-doped active layer for carrying out the APC examination at 70° C. and 30 mW. The deterioration of the device having the Mg-doped active layer is larger than the deterioration of the device having the undoped active layer.

In this embodiment, the novel nitride based semiconductor photo-luminescent device is applied to the semiconductor laser device. It is of course possible to apply the novel nitride based semiconductor photo-luminescent device to other devices such as the light emission diode and the super luminescent diode.

In accordance with the novel nitride based semiconductor photo-luminescent device, the active layer has the high dislocation density region and the low dislocation density region which has the current injection layer, and the active layer is less than $1\times10^{18}$ cm$^{-3}$ in impurity concentration to suppress the Auger re-combination and also suppress the extension and movement of the dislocations from the high dislocation density region to the current injection region in the low dislocation density region, whereby the life-time of the device under the high temperature and high output conditions is remarkably and greatly improved.

The nitride based semiconductor photo-luminescent device is formed over the mask patterns provided on the gallium nitride top surface of the epitaxial lateral overgrowth substrate, wherein said mask patterns have a mask width of not less than 25 micrometers to increase the width of the low dislocation density region for suppressing the influence by the high dislocation density region and for obtaining the high reliability under the high temperature and high output conditions.

The nitride based semiconductor photo-luminescent device is formed over selectively provided gallium nitride layers over the semi-insulating substrate of the mask-less epitaxial lateral overgrowth substrate, wherein said selectively provided gallium nitride layers have at least a window region having a window width of not less than 25 micrometers to increase the width of the low dislocation density region for suppressing the influence by the high dislocation density region and for obtaining the high reliability under the high temperature and high output conditions.

Figure 4:
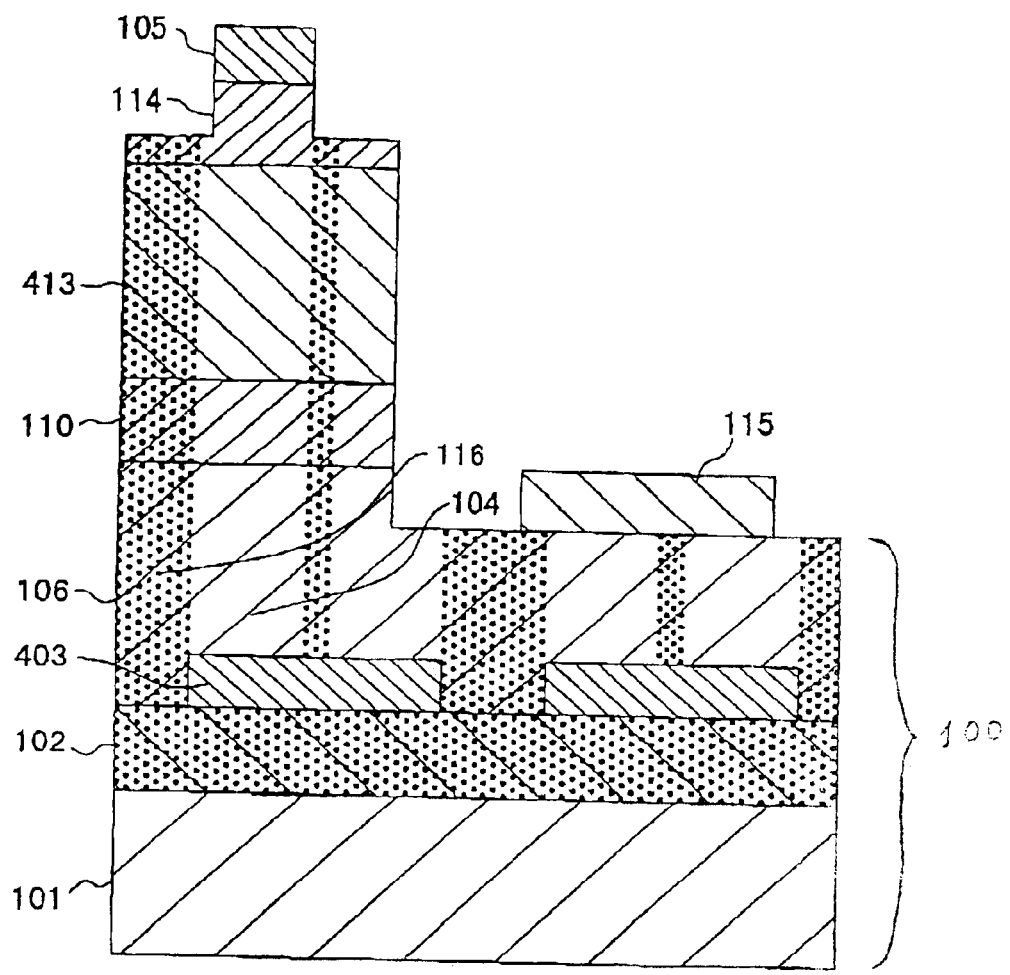
FIG. 4 is a fragmentary cross sectional elevation view illustrative of a third novel nitride based semiconductor laser diode in a third embodiment according to the present invention.

Third Embodiment:

A third embodiment according to the present invention will be described in detail with reference to the drawings. FIG. 4 is a fragmentary cross sectional elevation view illustrative of a third novel nitride based semiconductor laser diode in a third embodiment according to the present invention. The third novel nitride based semiconductor laser diode comprises a surface emitting laser diode with the following structure. A stripe-shaped multilayer mask 403 having window regions is selectively formed over a gallium nitride layer 102 over a top surface of a sapphire substrate 101, wherein the stripe-shaped multilayer mask 403 comprises 20 periods of alternating laminations of zirconium dioxide film and silicon dioxide film. The stripe-shaped multilayer mask 403 serves as a bottom dielectric multilayer reflective mirror. A gallium nitride layer 106 is grown over the stripe-shaped multilayer mask 403 and over the gallium nitride layer 102, wherein the gallium nitride layer has low dislocation density regions 104 which are positioned over the stripe-shaped multilayer mask 403.

A gallium nitride layer 102 is grown on the sapphire substrate 101 by a metal organic chemical vapor deposition method. The sapphire substrate 101 has a high surface dislocation density. The gallium nitride layer 102 has a high dislocation density. A stripe-shaped multilayer mask 403 having window regions is formed over the gallium nitride layer 102 in a [1,−1,0,0]-direction over a top surface of a sapphire substrate 101. A gallium nitride layer 106 is grown by a metal organic chemical vapor deposition method using the stripe-shaped multilayer mask 403 with the window regions. The gallium nitride layer 106 has a high dislocation density region 116 and a low dislocation density region 104. The high dislocation density region 116 is formed on the gallium nitride layer 102 having a high dislocation density. The high dislocation density region 116 is grown in a vertical direction from gallium nitride layer 102 having a high dislocation density shown by the window regions of the stripe-shaped multilayer mask 403, for which reason the dislocation is propagated from the gallium nitride layer 102 to the high dislocation density region 116, whereby the high dislocation density region 116 has a high dislocation density. The low dislocation density region 104 is formed over the stripe-shaped multilayer mask 403. The low dislocation density region 104 is grown by the epitaxial lateral overgrowth from the window regions of the stripe-shaped multilayer mask 403. The stripe-shaped multilayer mask 403 cuts the further propagation of the dislocation from the sapphire substrate 101. The low dislocation density region 104 has a low dislocation density. At the center of the low dislocation density region 104, epitaxial lateral overgrowths of gallium nitride in various lateral directions from the window regions of the stripe-shaped multilayer mask 403 come together, whereby new dislocations are formed, for which reason the center region of the low dislocation density region 104 has a high dislocation density. As a result, an Si-doped n-type gallium nitride epitaxial lateral overgrowth substrate 100 is completed which has the high dislocation density region 116 and the low dislocation density region 104.

A multiple quantum well active layer 110 is formed over the Si-doped n-type gallium nitride epitaxial lateral overgrowth substrate 100, wherein the multiple quantum well active layer 110 comprises alternating laminations of undoped n-type $In_{0.15}Ga_{0.85}N$ quantum well layer having a thickness of 3.5 nanometers and an undoped n-type $In_{0.02}Ga_{0.98}N$ potential barrier layer having a thickness of 10.5 nanometers. An Mg-doped p-type multilayer reflective mirror 413 is formed over the multiple quantum well active layer 110, wherein the Mg-doped p-type multilayer reflective mirror 413 comprises 40 periods of alternating laminations of an Mg-doped p-type $Al_{0.4}Ga_{0.6}N$ layer and an Mg-doped p-type GaN layer. An Mg-doped p-type GaN contact layer 114 having a thickness of 0.05 micrometers is formed over the Mg-doped p-type multilayer reflective mirror 413. The lamination structure over the Si-doped n-type gallium nitride epitaxial lateral overgrowth substrate 100 is selectively removed by a dry etching process to form a ridge structure over a predetermined region of the top surface of the Si-doped n-type gallium nitride epitaxial lateral overgrowth substrate 100, wherein the ridge structure comprises laminations of the upper region of the gallium nitride layer 106, the undoped multiple quantum well active layer 110, the Mg-doped p-type multilayer reflective mirror 413, and the the Mg-doped p-type GaN contact layer 114. The Mg-doped p-type GaN contact layer 114 is positioned over the low dislocation density region 104 for current injection into the low dislocation density region 104. A p-electrode 105 is formed on the Mg-doped p-type GaN contact layer 114, wherein the p-electrode 105 comprises an Ni layer and an Au layer. An n-electrode 115 is also selectively formed over the top surface of the Si-doped n-type gallium nitride epitaxial lateral overgrowth substrate 100, wherein the n-electrode 115 comprises an Ni layer and an Au layer. The n-electrode 115 is also positioned over the low dislocation density region 104 for current injection into the low dislocation density region 104. A laser is emitted from a bottom surface of the sapphire substrate 101 in a direction vertical to the bottom surface.

As compared to the above first type device, the second and third types devices were also prepared. The above first type device has the undoped active region, wherein the quantum well layers and the potential barrier layers are undoped. The second type device has the Si-doped active region with the Si-impurity concentration of $1\times10^{18}$ cm$^{-3}$ for each of the quantum well layers and the potential barrier layers. The second type device has the Si-doped active region with the Si-impurity concentration of $5\times10^{18}$ cm$^{-3}$ for each of the quantum well layers and the potential barrier layers.

Observations to the dislocations for each of the first to third types devices have been carried out by use of a transmission electron microscope. The high density dislocation region 116 and the low density dislocation region 104 are observed for each of the first to third types devices, wherein the dislocation density of the high dislocation density region 116 is about $5\times10^{12}$ m$^{-2}$, and the dislocation density of the low dislocation density region 104 is about $2\times10^{10}$ m$^{-2}$. A large difference in dislocation density was observed between the high dislocation density region 116 and the low dislocation density region 104. The dislocation density is measurable by the transmission electron microscope. The dislocation density may also be measurable by the etch-pit density. A mixture liquid of phosphoric acid and sulfuric acid is heated at 200° C. Samples of the above six types are dipped into the solution for about 1 hour to form etch-pits at the positions of the dislocations, wherein the etch-pit density almost corresponds to the dislocation density.

If the dislocation density or the etch-pit density is low, then it is necessary for realizing a highly accurate measurement that the number of dislocations or etch-pits distributed in a large area is counted. For example, the dislocation density is about $1\times10^{11}$ m$^{-2}$, then the area of at least $1\times10^{-10}$ m$^2$ is necessary for the highly accurate measurement to the dislocation density or the etch-pit density. The area of at least $1\times10^{-10}$ m$^2$ corresponds to a 10 micrometers squares. If the gallium nitride layer is grown over the epitaxial lateral overgrowth substrate, then the dislocation density has a large special variation in a direction perpendicular to the longitudinal direction of the striped-shape silicon dioxide masks. It is preferable that the measurement is made in a rectangle-shaped area of 100 micrometers in a first direction and 1 micrometer in a second direction, wherein the first direction is parallel to the longitudinal direction of the striped-shape silicon dioxide masks whilst the second direction is perpendicular to the longitudinal direction of the striped-shape silicon dioxide masks.

The APC examination for 100 hours under high temperature and high output conditions of 70° C. and 30 mW was carried out to the first to third type devices.

There was no large difference in the initial threshold current density in the above first to third devices. The third type device having the Si-impurity concentration of $5\times10^{18}$ cm$^{-3}$ for the active layer showed a remarkable deterioration, wherein the laser emission is discontinued before 100 hours operation, whilst the remaining first and second type devices showed almost no deteriorations. The third type device was observed in dislocation by the transmission electron microscope. It was confirmed that the dislocations in the high dislocation density region extend to the low dislocation density region.

Before this examination the high dislocation density region of each of the above first to third type devices was distanced by about 3 micrometers from the current injection region of the active layer. After the examination, the high dislocation density region of the third type device only extends to the current injection region of the active layer. After the examination, the high dislocation density region of each of the above first and second type devices remained distanced by about 3 micrometers from the current injection region of the active layer. Namely, the distribution of the dislocation density remained unchanged for the first and second type devices having the undoped active layers and the Si-impurity concentration of $5\times10^{18}$ cm$^{-3}$.

In accordance with this embodiment, if the high dislocation density region 116 is present within 5 micrometers from the current injection region of the active layer, the low impurity concentration of not more than $1\times10^{18}$ cm$^{-3}$ of the active layer provides a remarkable effect of suppressing the dislocation motion and extension. If the active layer is undoped, then the movement or extension of the dislocation from the high dislocation density region to the low dislocation density region is suppressed, the life-time of the laser device under the high temperature and high output conditions is remarkably and greatly improved.

If the other impurity is not doped into the active layer or the active layer is Mg-undoped, the life-time is largely and greatly improved under the high temperature and high output conditions. The present inventors prepared the different devices having the undoped active layer and the Mg-doped active layer for carrying out the APC examination at 70° C. and 30 mW. The deterioration of the device having the Mg-doped active layer is larger than the deterioration of the device having the undoped active layer.

In this embodiment, the novel nitride based semiconductor photo-luminescent device is applied to the semiconductor laser device. It is of course possible to apply the novel nitride based semiconductor photo-luminescent device to other devices such as the light emission diode and the super luminescent diode.

In accordance with the novel nitride based semiconductor photo-luminescent device, the active layer has the high dislocation density region and the low dislocation density region which has the current injection layer, and the active layer is less than $1\times10^{18}$ cm$^{-3}$ in impurity concentration to suppress the Auger re-combination and also suppress the extension and movement of the dislocations from the high dislocation density region to the current injection region in the low dislocation density region, whereby the life-time of the device under the high temperature and high output conditions is remarkably and greatly improved.

The nitride based semiconductor photo-luminescent device is formed over the mask patterns provided on the gallium nitride top surface of the epitaxial lateral overgrowth substrate, wherein said mask patterns have a mask width of not less than 25 micrometers to increase the width of the low dislocation density region for suppressing the influence by the high dislocation density region and for obtaining the high reliability under the high temperature and high output conditions.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A nitride based semiconductor photo-luminescent device having an active layer, said active layer having both at least a high dislocation density region and at least a low dislocation density region lower in dislocation density than said high dislocation density region, wherein said low dislocation density region includes a current injection region into which a current is injected, and said active layer is less than $1\times10^{18}$ cm$^{-3}$ in impurity concentration, wherein a dislocation density of the low dislocation density region is not more than one tenth of at least one of a dislocation density of the high dislocation density region and an averaged dislocation density of the active layer.

2. The nitride based semiconductor photo-luminescent device as claimed in claim 1, wherein a dislocation density of at least a part of the high dislocation density region is not less than $1\times10^{12}$ m$^{-2}$ and an average dislocation density of the current injection region in the low dislocation density region is less than $1\times10^{11}$ m$^{-2}$.

3. The nitride based semiconductor photo-luminescent device as claimed in claim 1, wherein an average dislocation density of the active layer is not less than $1\times10^{12}$ m$^{-2}$, and an average dislocation density of the current injection region in the low dislocation density region is less than $1\times10^{11}$ m$^{-2}$.

4. The nitride based semiconductor photo-luminescent device as claimed in claim 1, wherein an average dislocation density of the current injection region is less than $1\times10^{11}$ m$^{-2}$, and an average dislocation density of a peripheral region within a distance of 5 micrometers from the current injection region in the low dislocation density region is not less than $1\times10^{12}$ m$^{-2}$.

5. The nitride based semiconductor photo-luminescent device as claimed in claim 1, wherein a current injection electrode is provided over an upper semiconductor layer overlying the active layer, and the active layer has an under-positioned region which is positioned under the current injection electrode, and an average dislocation density of the under-positioned region of the active layer is less than $1\times10^{11}$ m$^{-2}$, and an average dislocation density of a peripheral region within a distance of 5 micrometers from the under-positioned region is not less than $1\times10^{12}$ m$^{-2}$.

6. The nitride based semiconductor photo-luminescent device as claimed in claim 1, wherein an average dislocation density of a peripheral region within a distance of 5 micrometers from the current injection region in the low dislocation density region is not more than one tenth of an average dislocation density of the current injection region.

7. The nitride based semiconductor photo-luminescent device as claimed in claim 1, wherein a current injection electrode is provided over an upper semiconductor layer overlying the active layer, and the active layer has an under-positioned region which is positioned under the current injection electrode, and an average dislocation density of the under-positioned region of the active layer is not more than one tenth of an average dislocation density of an average dislocation density of a peripheral region within a distance of 5 micrometers from the under-positioned region.

8. The nitride based semiconductor photo-luminescent device as claimed in claim 1, wherein a higher dislocation density region having a dislocation density of not less than ten times of a dislocation density of the current injection region is present in a peripheral region within a distance of 5 micrometers from the current injection region.

9. The nitride based semiconductor photo-luminescent device as claimed in claim 1, wherein said nitride based semiconductor photo-luminescent device is provided over dielectric mask patterns provided on a gallium nitride top surface of an epitaxial lateral overgrowth substrate, and said dielectric mask patterns have a mask width of not less than 25 micrometers.

10. The nitride based semiconductor photo-luminescent device as claimed in claim 9, wherein said dielectric mask patterns comprise single-layered dielectric mask patterns.

11. The nitride based semiconductor photo-luminescent device as claimed in claim 9, wherein said dielectric mask patterns comprise dielectric multilayer reflective mirrors.

12. The nitride based semiconductor photo-luminescent device as claimed in claim 1, wherein said nitride based semiconductor photo-luminescent device is provided over selectively provided gallium nitride layers over a semi-insulating substrate of a mask-less epitaxial lateral overgrowth substrate.

13. The nitride based semiconductor photo-luminescent device as claimed in claim 12, wherein said selectively provided gallium nitride layers have at least a window region having a window width of not less than 25 micrometers.

14. The nitride based semiconductor photo-luminescent device as claimed in claim 1, wherein said active layer is undoped.

15. The nitride based semiconductor photo-luminescent device as claimed in claim 1, wherein said active layer comprises a multiple quantum well structure comprising alternating laminations of undoped quantum well layers and undoped potential barrier layers.

16. The nitride based semiconductor photo-luminescent device as claimed in claim 1, wherein said active layer comprises a multiple quantum well structure comprising alternating laminations of undoped quantum well layers and Si-doped potential barrier layers having an impurity concentration of less than $1 \times 10^{18}$ cm$^{-3}$.

17. The nitride based semiconductor photo-luminescent device as claimed in claim 1, wherein said active layer comprises a multiple quantum well structure comprising alternating laminations of Si-doped quantum well layers having an impurity concentration of less than $1 \times 10^{18}$ cm$^{-3}$ and undoped potential barrier layers.

18. The nitride based semiconductor photo-luminescent device as claimed in claim 1, wherein said active layer comprises a multiple quantum well structure comprising alternating laminations of Si-doped quantum well layers having an impurity concentration of less than $1 \times 10^{18}$ cm$^{-3}$ and Si-doped potential barrier layers having an impurity concentration of less than $1 \times 10^{18}$ cm$^{-3}$.

19. A nitride based semiconductor photo-luminescent device having an active layer over an epitaxial lateral overgrowth substrate having a dielectric mask pattern with a window region, said active layer having both at least a high dislocation density region positioned over said window region and at least a low dislocation density region positioned over said dielectric mask pattern, and said low dislocation density region being lower in dislocation density than said high dislocation density region,
wherein said low dislocation density region includes a current injection region into which a current is injected, and said active layer is less than $1 \times 10^{18}$ cm$^{-3}$ in impurity concentration, and
wherein a dislocation density of the low dislocation density region is not more than one tenth of at least one of a dislocation density of the high dislocation density region and an averaged dislocation density of the active layer.

20. The nitride based semiconductor photo-luminescent device as claimed in claim 19 wherein a dislocation density of at least a part of the high dislocation density region is not less than $1 \times 10^{12}$ m$^{-2}$, and an average dislocation density of the current injection region in the low dislocation density region is less than $1 \times 10^{11}$ m$^{-2}$.

21. The nitride based semiconductor photo-luminescent device as claimed in claim 19, wherein an average dislocation density of the active layer is not less than $1 \times 10^{12}$ m$^{-2}$, and an average dislocation density of the current injection region in the low dislocation density region is less than $1 \times 10^{11}$ m$^{-2}$.

22. The nitride based semiconductor photo-luminescent device as claimed in claim 19, wherein an average dislocation density of the current injection region is less than $1 \times 10^{11}$ m$^{-2}$, and an average dislocation density of a peripheral region within a distance of 5 micrometers from the current injection region in the low dislocation density region is not less than $1 \times 10^{12}$ m$^{-2}$.

23. The nitride based semiconductor photo-luminescent device as claimed in claim 19, wherein a current injection electrode is provided over an upper semiconductor layer overlying the active layer, and the active layer has an under-positioned region which is positioned under the current injection electrode, and an average dislocation density of the under-positioned region of the active layer is less than $1 \times 10^{11}$ m$^{-2}$, and an average dislocation density of a peripheral region within a distance of 5 micrometers from the under-positioned region is not less than $1 \times 10^{12}$ m$^{-2}$.

24. The nitride based semiconductor photo-luminescent device as claimed in claim 19, wherein an average dislocation density of a peripheral region within a distance of 5 micrometers from the current injection region in the low dislocation density region is not more than one tenth of an average dislocation density of the current injection region.

25. The nitride based semiconductor photo-luminescent device as claimed in claim 19, wherein a current injection electrode is provided over an upper semiconductor layer overlying the active layer, and the active layer has an under-positioned region which is positioned under the current injection electrode, and an average dislocation density of the under-positioned region of the active layer is not more than one tenth of an average dislocation density of an average dislocation density of a peripheral region within a distance of 5 micrometers from the under-positioned region.

26. The nitride based semiconductor photo-luminescent device as claimed in claim 19, wherein a higher dislocation density region having a dislocation density of not less than ten times of a dislocation density of the current injection region is present in a peripheral region within a distance of 5 micrometers from the current injection region.

27. The nitride based semiconductor photo-luminescent device as claimed in claim 19, wherein said dielectric mask patterns have a mask width of not less than 25 micrometers.

28. The nitride based semiconductor photo-luminescent device as claimed in claim 19, wherein said dielectric mask patterns comprise single-layered dielectric mask patterns.

29. The nitride based semiconductor photo-luminescent device as claimed in claim 19, wherein said dielectric mask patterns comprise dielectric multilayer reflective mirrors.

30. The nitride based semiconductor photo-luminescent device as claimed in claim 19, wherein said active layer is undoped.

31. The nitride based semiconductor photo-luminescent device as claimed in claim 19, wherein said active layer comprises a multiple quantum well structure comprising alternating laminations of undoped quantum well layers and undoped potential barrier layers.

32. The nitride based semiconductor photo-luminescent device as claimed in claim 19, wherein said active layer comprises a multiple quantum well structure comprising alternating laminations of undoped quantum well layers and Si-doped potential barrier layers having an impurity concentration of less than $1 \times 10^{18}$ cm$^{-3}$.

33. The nitride based semiconductor photo-luminescent device as claimed in claim 19, wherein said active layer comprises a multiple quantum well structure comprising alternating laminations of Si-doped quantum well layers having an impurity concentration of less than $1 \times 10^{18}$ cm$^{-3}$ and undoped potential barrier layers.

34. The nitride based semiconductor photo-luminescent device as claimed in claim 19, wherein said active layer comprises a multiple quantum well structure comprising alternating laminations of Si-doped quantum well layers having an impurity concentration of less than $1 \times 10^{18}$ cm$^{-3}$ and Si-doped potential barrier layers having an impurity concentration of less than $1 \times 10^{18}$ cm$^{-3}$.

* * * * *